United States Patent
Sugiura

(10) Patent No.: US 12,069,959 B2
(45) Date of Patent: Aug. 20, 2024

(54) MAGNETIC MEMORY DEVICE AND MANUFACTURING METHOD OF MAGNETIC MEMORY DEVICE

(71) Applicant: Kioxia Corporation, Tokyo (JP)

(72) Inventor: Kuniaki Sugiura, Seoul (KR)

(73) Assignee: Kioxia Corporation, Tokyo (JP)

( * ) Notice: Subject to any disclaimer, the term of this patent is extended or adjusted under 35 U.S.C. 154(b) by 465 days.

(21) Appl. No.: 17/198,522

(22) Filed: Mar. 11, 2021

(65) Prior Publication Data
US 2022/0085282 A1 Mar. 17, 2022

(30) Foreign Application Priority Data

Sep. 17, 2020 (JP) .................................. 2020-156141

(51) Int. Cl.
| | |
|---|---|
| H10N 50/10 | (2023.01) |
| H10B 61/00 | (2023.01) |
| H10N 50/01 | (2023.01) |
| H10N 50/80 | (2023.01) |
| H10N 50/85 | (2023.01) |

(52) U.S. Cl.
CPC ............. *H10N 50/10* (2023.02); *H10B 61/00* (2023.02); *H10N 50/01* (2023.02); *H10N 50/80* (2023.02); *H10N 50/85* (2023.02)

(58) Field of Classification Search
None
See application file for complete search history.

(56) References Cited

U.S. PATENT DOCUMENTS

| | | | | |
|---|---|---|---|---|
| 10,438,995 | B2* | 10/2019 | Kim ...................... | H10B 61/00 |
| 10,707,269 | B2 | 7/2020 | Nagase et al. | |
| 2014/0269005 | A1* | 9/2014 | Kang ..................... | H10B 63/80 |
| | | | | 257/4 |
| 2016/0005963 | A1* | 1/2016 | Kim ...................... | H10B 63/22 |
| | | | | 257/4 |
| 2019/0096461 | A1* | 3/2019 | Koike ................... | G11C 11/161 |
| 2020/0083285 | A1* | 3/2020 | Nagase ............... | H01F 10/3254 |

FOREIGN PATENT DOCUMENTS

JP 2020043131 A 3/2020

* cited by examiner

*Primary Examiner* — Nilufa Rahim
(74) *Attorney, Agent, or Firm* — Holtz, Holtz & Volek PC

(57) ABSTRACT

According to one embodiment, a magnetic memory device includes a first magnetoresistance effect element provided above a substrate, a first switching element member, and a first conductor. Each of the first switching element member and the first conductor is provided above the first magnetoresistance effect element. The first switching element member includes a first portion in contact with a lower surface of the first conductor directly above the first magnetoresistance effect element. An area of a lower surface of the first switching element member is smaller than a cross-sectional area of the first switching element member along the lower surface of the first conductor.

18 Claims, 21 Drawing Sheets

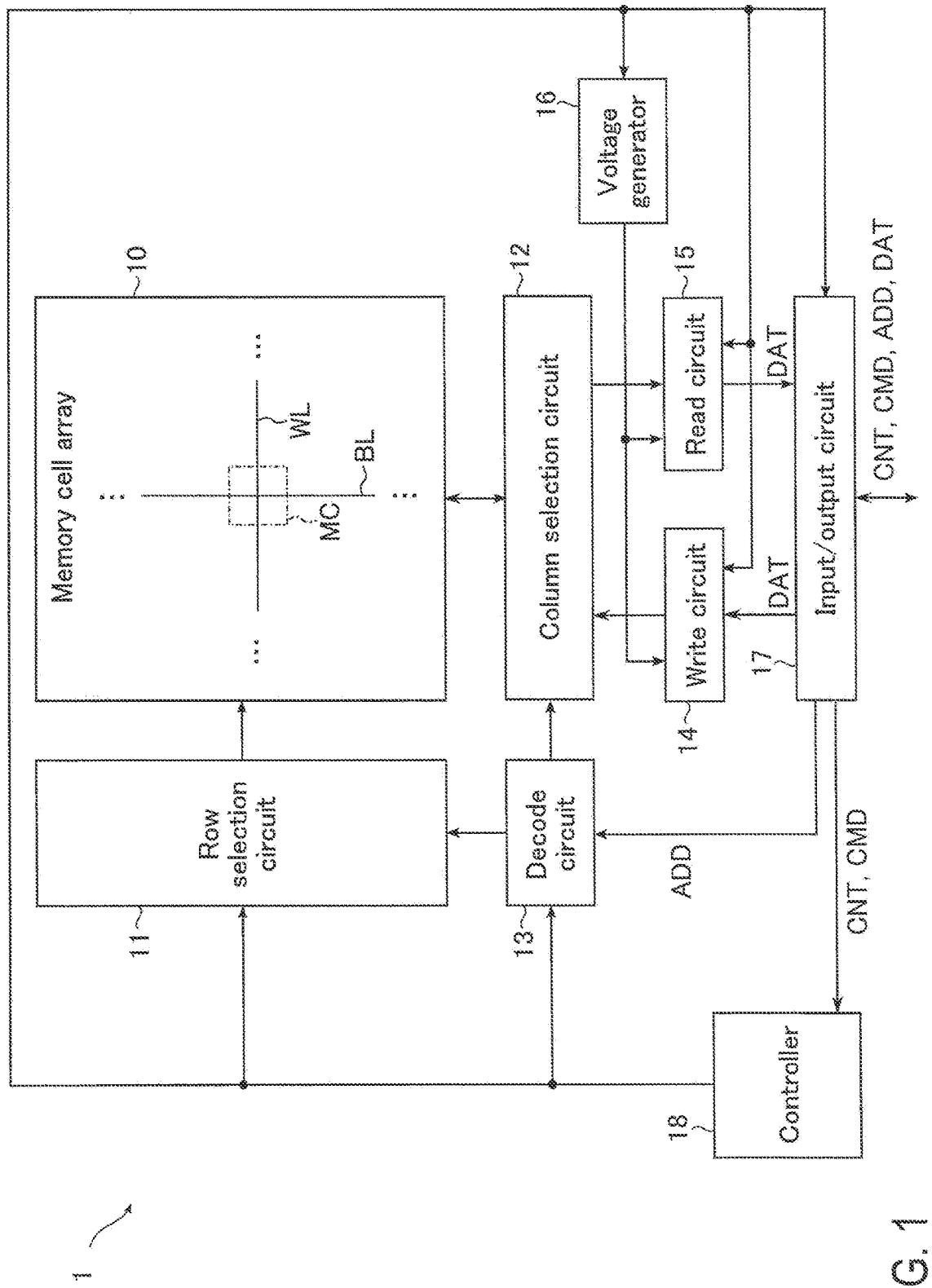
F I G. 1

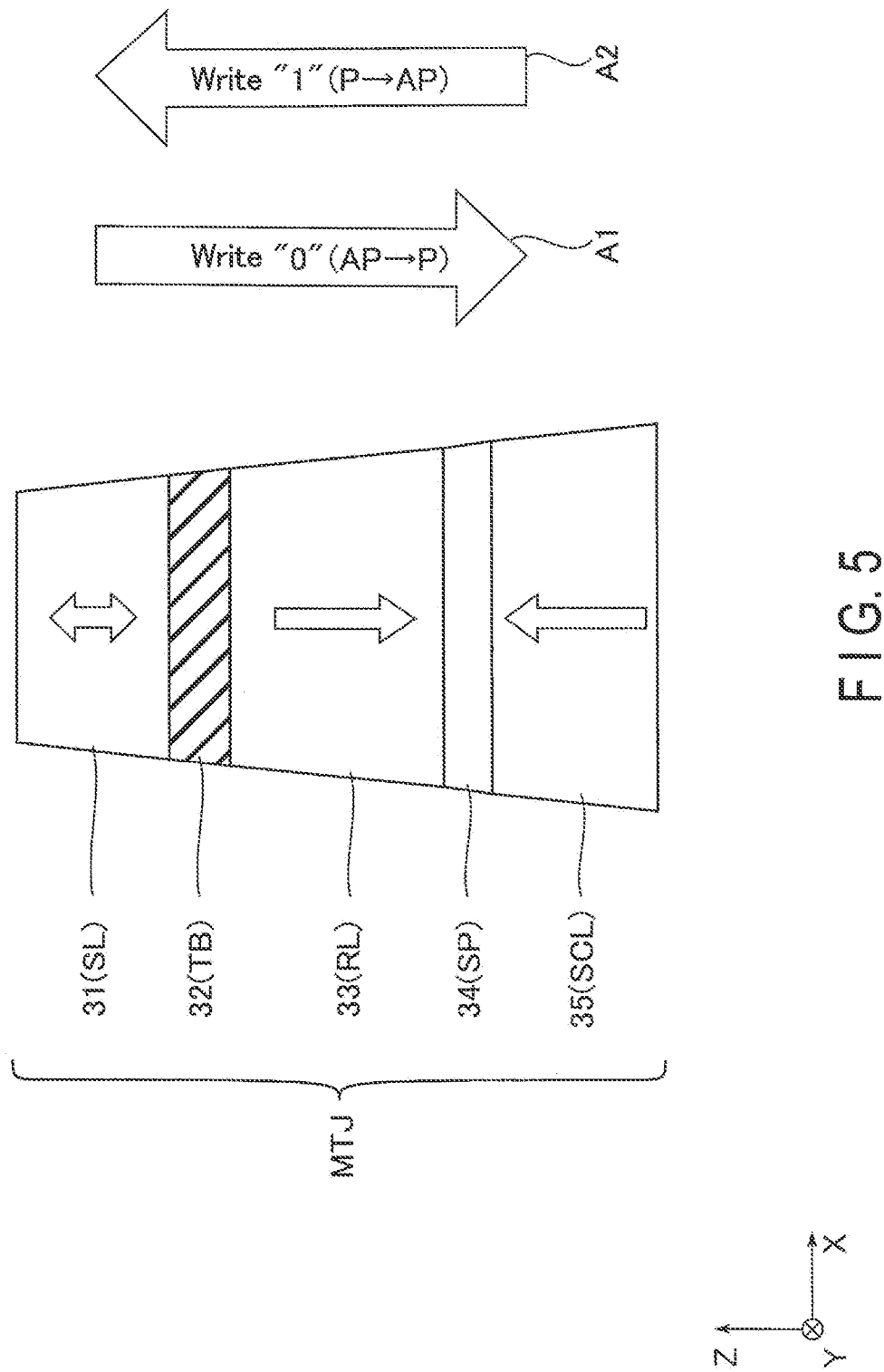
F I G. 5

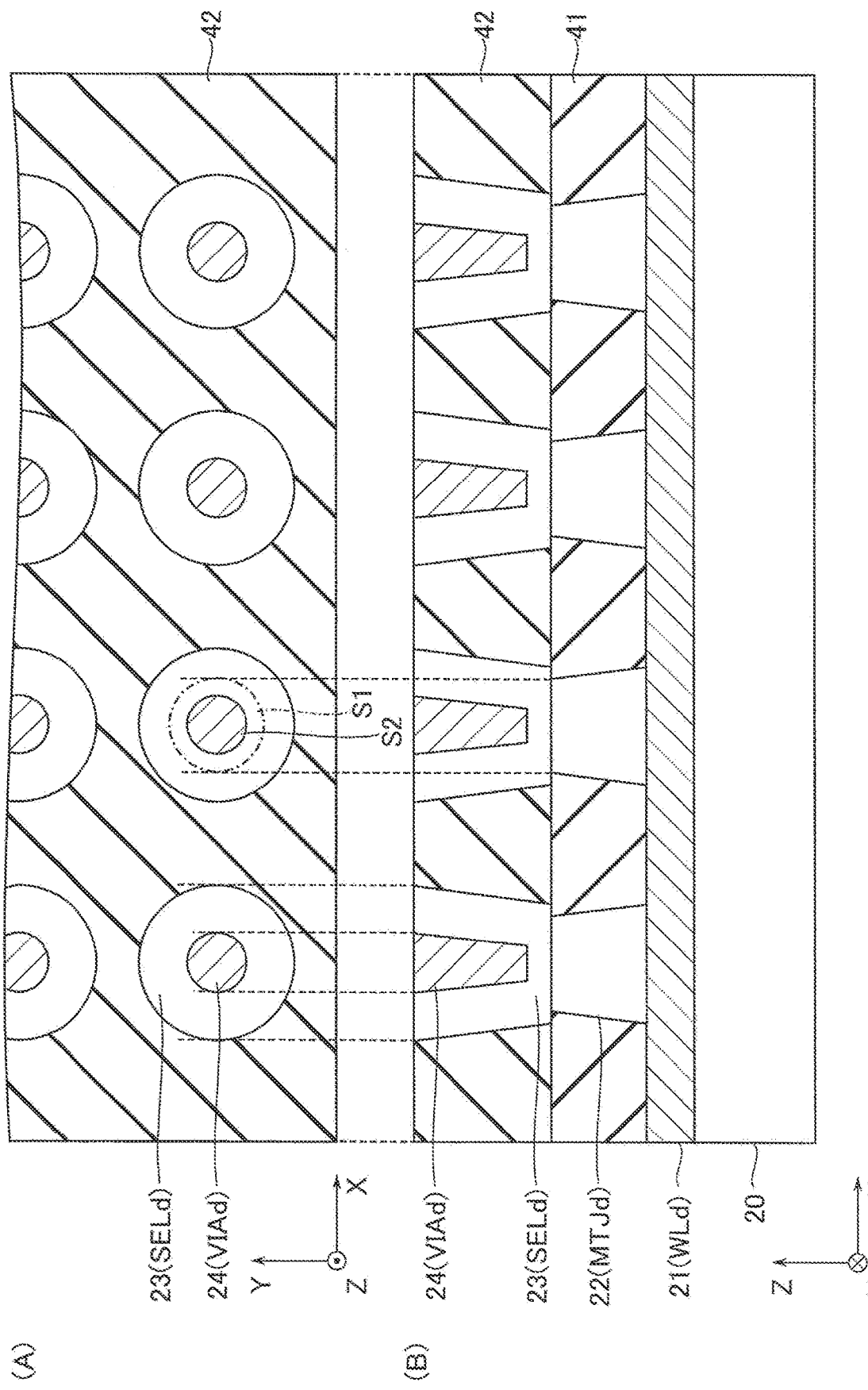
F I G. 9

MAGNETIC MEMORY DEVICE AND MANUFACTURING METHOD OF MAGNETIC MEMORY DEVICE

CROSS-REFERENCE TO RELATED APPLICATIONS

This application is based upon and claims the benefit of priority from Japanese Patent Application No. 2020-156141, filed Sep. 17, 2020, the entire contents of which are incorporated herein by reference.

FIELD

Embodiments described herein relate generally to a magnetic memory device and a manufacturing method of the magnetic memory device.

BACKGROUND

A magnetic memory device (magnetoresistive random access memory: MRAM) using resistance change elements as storage elements is known.

BRIEF DESCRIPTION OF THE DRAWINGS

FIG. 1 is a block diagram illustrating a configuration of a magnetic memory device according to a first embodiment;

FIG. 5 is a cross-sectional view illustrating a configuration of a magnetoresistance effect element of the magnetic memory device according to the first embodiment;

FIG. 9 is a schematic diagram illustrating the method of manufacturing the memory cell array of the magnetic memory device according to the first embodiment;

DETAILED DESCRIPTION

Figure 2:
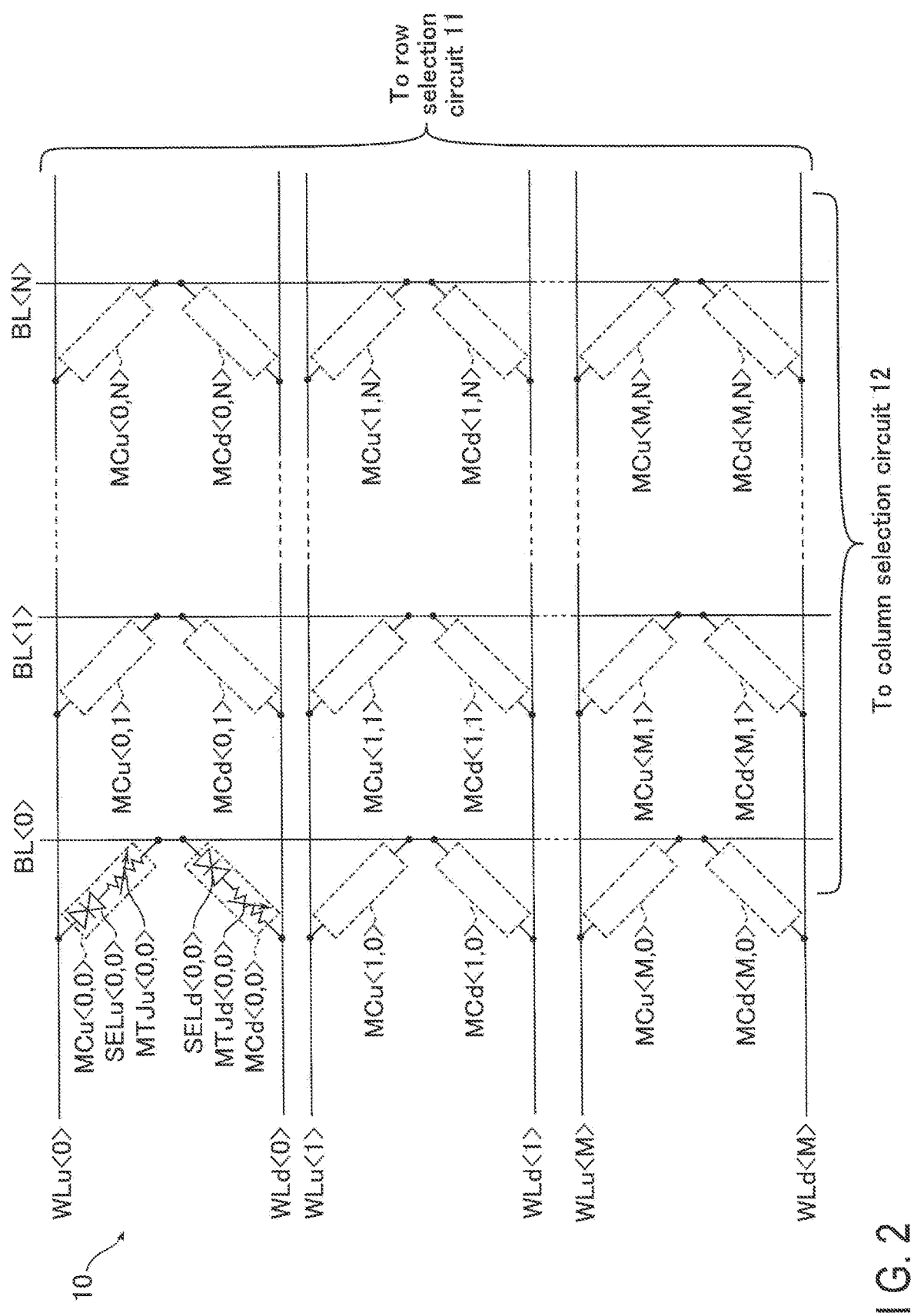
FIG. 2 is a circuit diagram illustrating a configuration of a memory cell array of the magnetic memory device according to the first embodiment.

In general, according to one embodiment, a magnetic memory device includes a first magnetoresistance effect element provided above a substrate, a first switching element member, and a first conductor. Each of the first switching element member and the first conductor is provided above the first magnetoresistance effect element. The first switching element member includes a first portion in contact with a lower surface of the first conductor directly above the first magnetoresistance effect element. An area of a lower surface of the first switching element member is smaller than a cross-sectional area of the first switching element member along the lower surface of the first conductor.

The embodiments of the present invention will be explained with reference to the drawings. In the following explanation, components having the same functions and structures will be referred to by the same reference symbol. If structural components having the same reference symbols need to be distinguished from each other, letters or numerals may be added to the symbols. If the structural components do not particularly need to be distinguished from each other, only the common symbols are used without adding letters or numerals thereto. The additional letters or numerals are not limited to a superscript or subscript, but may be lowercase letters and indices indicating the arrangement order attached to the end of a reference symbol.

1. First Embodiment

A magnetic memory device according to a first embodiment will be described. The magnetic memory device according to the first embodiment includes, for example, a magnetic memory device according to perpendicular magnetic recording, using, as resistance change elements, elements exhibiting magnetoresistance effects through magnetic tunnel junction (MTJ) ("MTJ element"). The MTJ element may also be referred to as a magnetoresistance effect element. Embodiments below including the present embodiment will be described for a case where the MTJ element is applied as the magnetoresistance effect element. Further, description will be given using the wording "magnetoresistance effect element MTJ" for the sake of convenience.

1.1 Configuration

First, a configuration of a magnetic memory device according to the first embodiment will be described.

1.1.1 Magnetic Memory Device

FIG. 1 is a block diagram illustrating a configuration of a magnetic memory device according to the first embodiment. As shown in FIG. 1, a magnetic memory device 1 includes a memory cell array 10, a row selection circuit 11, a column selection circuit 12, a decode circuit 13, a write circuit 14, a read circuit 15, a voltage generator 16, an input/output circuit 17, and a controller 18.

The memory cell array 10 includes a plurality of memory cells MC each associated with a pair of a row and a column. Specifically, memory cells MC arranged in the same row are coupled to the same word line WL, and memory cells MC arranged in the same column are coupled to the same bit line BL.

The row selection circuit 11 is coupled to the memory cell array 10 by way of word lines WL. The row selection circuit 11 is supplied with a decoded result of an address ADD (i.e., a row address) from the decode circuit 13. The row selection circuit 11 sets a word line WL corresponding to the row indicated by the decoded result of the address ADD to a selected state. Hereinafter, a word line WL set to a selected state will be referred to as a selected word line WL. Word lines WL other than the selected word line WL will be referred to ac non-selected word lines WL.

The column selection circuit 12 is coupled to the memory cell array 10 by way of bit lines BL. The column selection circuit 12 is supplied with a decoded result of an address ADD (i.e., a column address) from the decode circuit 13. The column selection circuit 12 sets a bit line BL corresponding to the column indicated by the decoding results of address ADD, to a selected state. Hereinafter, a bit line BL set to a selected state will be referred to as a selected bit line BL. Bit lines BL other than the selected bit line BL will be referred to as non-selected bit lines BL.

The decode circuit 13 decodes an address ADD from the input/output circuit 17. The decode circuit 13 supplies a decoding result of the address ADD to the row selection circuit 11 and the column selection circuit 12. The address ADD includes addresses of a column and a row to be selected.

The write circuit 14 writes data to each memory cell MC. The write circuit 14 includes, for example, a write driver (not shown).

The read circuit 15 reads data from each memory cell MC. The read circuit 15 includes, for example, a sense amplifier (not shown).

The voltage generator 16 generates voltages for various types of operations of the memory cell array 10, using a power supply voltage provided by an outside (not illustrated) of the magnetic memory device 1. The voltage generator 16 generates, for example, a variety of voltages necessary for a write operation, and outputs the generated voltages to the write circuit 14. The voltage generator 16 also generates voltages required for a read operation and outputs them to the read circuit 15.

The input/output circuit 17 transfers an address ADD received from the outside of the magnetic memory device 1, to the decode circuit 13. The input/output circuit 17 also transfers a command CMD received from the outside of the magnetic memory device 1, to the controller 18. The input/output circuit 17 transmits and receives various control signals CNT between the outside of the magnetic memory device 1 and the controller 18. The input/output circuit 17 transfers to the write circuit 14 the data DAT received from the outside of the magnetic memory device 1, and outputs to the outside of the magnetic memory device 1 the data DAT transferred from the read circuit 15.

The controller 18 controls the operations of the row selection circuit 11, the column selection circuit 12, the decode circuit 13, the write circuit 14, the read circuit 15, the voltage generator 16, and the input/output circuit 17 in the magnetic memory device 1 based on control signal CNT and command CMD.

1.1.2 Memory Cell Array

Next, a configuration of the memory cell array of the magnetic memory device according to the first embodiment will be described with reference to FIG. 2. FIG. 2 is a circuit diagram illustrating the configuration of the memory cell array of the magnetic memory device according to the first embodiment. In FIG. 2, the word lines WL are classified by symbols including two lower-case alphabetic characters ("u" and "d") and indices ("< >").

As shown in FIG. 2, the memory cells MC are arranged in a matrix pattern in the memory cell array 10, with each memory cell MC associated with a set consisting of one of the bit lines BL (BL<0>, BL<1>, ..., BL<N>) and one of the word lines WLd (WLd<0>, WLd<1>, ..., WLd<M>) and WLu (WLu<0>, WLu<1>, ..., WLu<M>), where M and N are any integers. That is, a memory cell MCd<i, j> (where 0≤i≤M and 0≤j≤N) is coupled between the word line WLd<i> and the bit line BL<j>, and a memory cell MCu<i, j> is coupled between the word line WLu<i> and the bit line BL<j>.

The symbols "d" and "u" are designed to respectively distinguish between, for example, memory cells MC provided below the bit lines BL and memory cells MC provided above the bit lines BL. The three-dimensional structure of the memory cell array 10 will be described in detail later.

The memory cell MCd<i, j> includes a switching element SELd<i, j> and a magnetoresistance effect element MTJd<i, j> coupled in series, and the memory cell MCu<i, j> includes a switching element SELu<i, j> and a magnetoresistance effect element MTJu<i, j> coupled in series.

The switching element SEL has a function as a switch that controls a current supply to a corresponding magnetoresistance effect element MTJ when data is read from and written to the magnetoresistance effect element MTJ. More specifically, a switching element SEL in a memory cell MC functions as an insulator with a large resistance value and interrupts a current (i.e., is turned off) when a voltage applied to the memory cell MC is below a threshold voltage Vth, and functions as a conductor with a low resistance value allowing a current to flow therethrough (i.e., is turned on) when the voltage applied to the memory cell MC exceeds the threshold voltage Vth. That is, a switching element SEL has a function of switching between a state of allowing a current to flow and a state of interrupting a current, in accordance with the magnitude of a voltage applied to a memory cell MC, regardless of the direction of the current flow.

A switching element SEL may be, for example, a two-terminal switching element. When a voltage applied between two terminals is smaller than a threshold voltage, a corresponding switching element is in a "high-resistance" state, e.g., in an electrically non-conductive state. When a voltage applied between two terminals is equal to or greater than the threshold value, a corresponding switching element transitions to a "low-resistance" state, e.g., to an electrically conductive state. The switching element may have this function, regardless of the polarity of the voltage.

The magnetoresistance effect element MTJ is capable or switching its resistance value between a low-resistance state and a high-resistance state, based on a current whose supply is controlled by the switching element SEL. The magnetoresistance effect element MTJ functions as a memory element that allows data to be written therein according to a change in its resistance state, retains the written data in a non-volatile manner, and allows the retained data to be read therefrom.

However, if a switching element SEL is short-circuited due to some sort of defect, it is no longer possible for the switching element SEL to control a current flowing through a magnetoresistance effect element MTJ in accordance with a voltage being applied. In this case, a flowing current may not be controlled for all of the memory cells MC using, as current paths, bit lines BL or word lines WL coupled to the short-circuited switching element SEL, which is not preferable.

Figure 3:
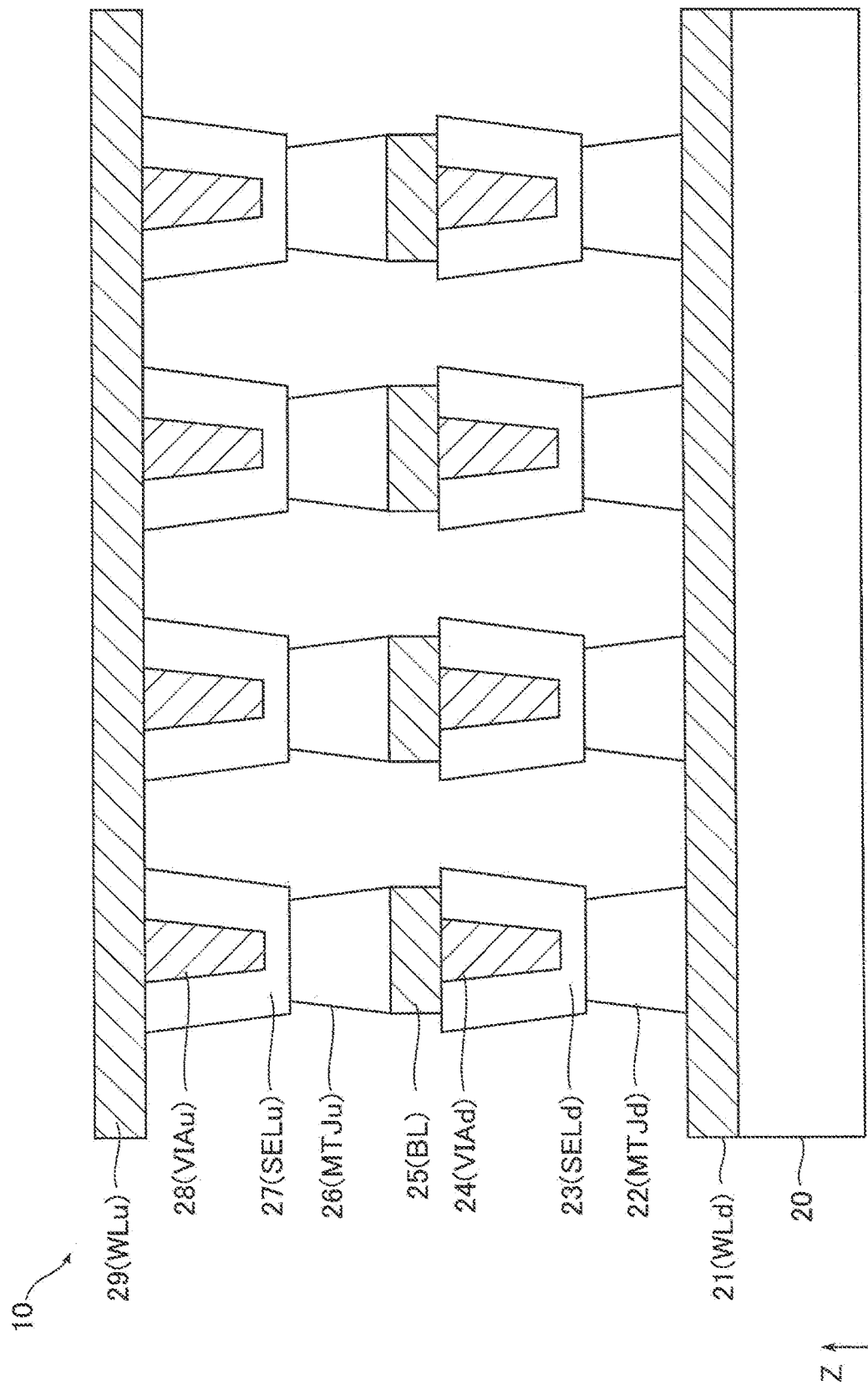
FIG. 3 is a cross-sectional view illustrating the configuration of the memory cell array of the magnetic memory device according to the first embodiment.
Figure 4:
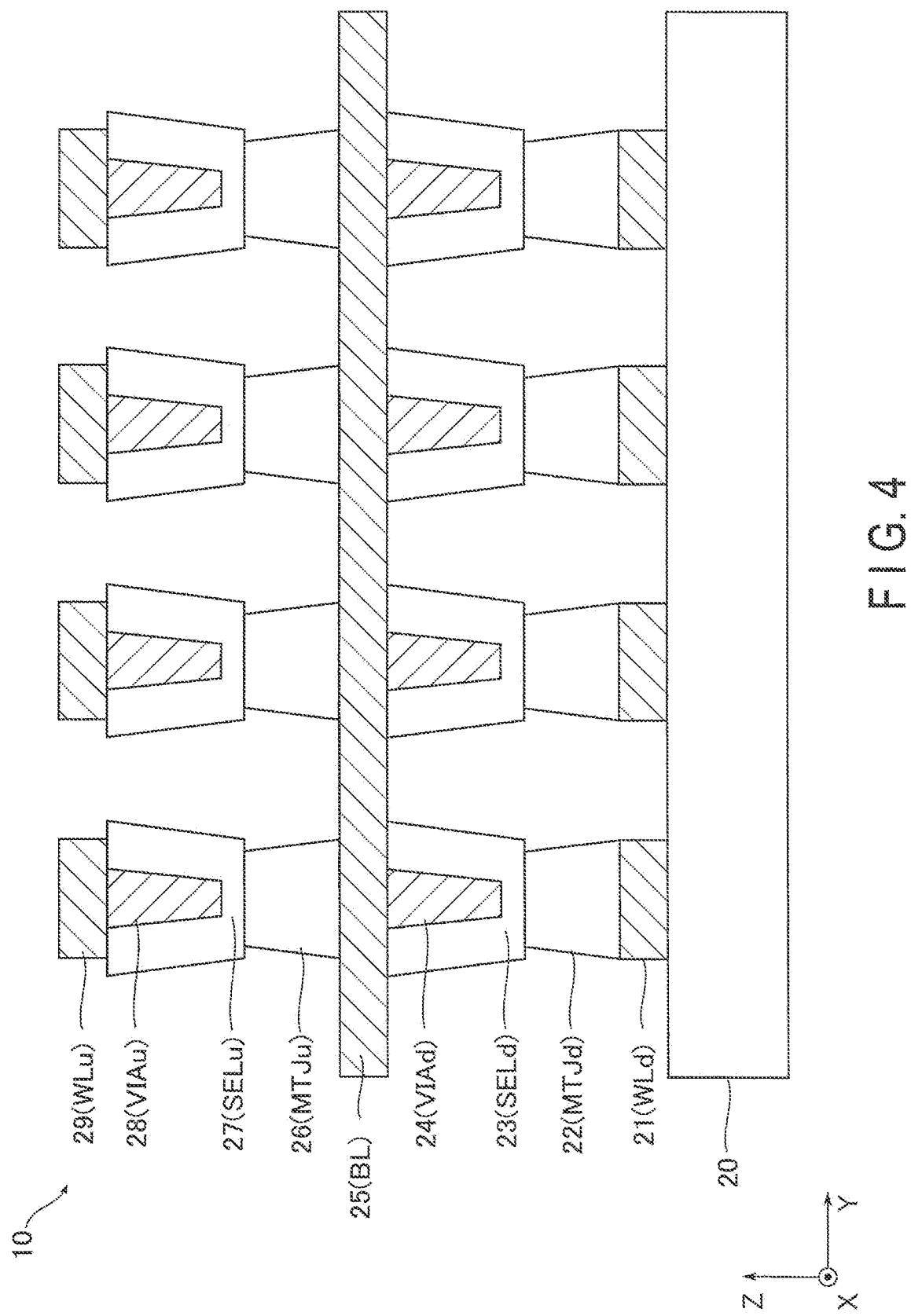
FIG. 4 is a cross-sectional view illustrating the configuration of the memory cell array of the magnetic memory device according to the first embodiment.

Next, the cross-sectional configuration of the memory cell array 10 will be described with reference to FIGS. 3 and 4. FIGS. 3 and 4 each show an example of a cross-sectional view illustrating a configuration of the memory cell array of the magnetic memory device according to the first embodiment. In FIGS. 3 and 4, illustration of interlayer insulating films is omitted for the sake of convenience.

As shown in FIGS. 3 and 4, the memory cell array 10 is provided above the semiconductor substrate 20. in the following description, a plane parallel to a surface of the semiconductor substrate 20 will be referred to as an "XY plane", and an axis perpendicular to the XY plane will be referred to as a "Z axis". The direction approaching the semiconductor substrate 20 along the Z axis will be referred to as a "lower" side, while the direction away from the semiconductor substrate 20 will be referred to as an "upper" side. Within the XY plane, two axes perpendicular to each other form a pair, and one of these axes will be referred to as an "X axis" and the other will be referred to as a "Y axis".

The semiconductor substrate 20 has an upper surface provided with, for example, a plurality of conductors 21. The conductors 21 may be aligned along the Y-axis, each extending along the X-axis. The conductors 21 each have conductivity and function as the word lines WLd. The conductor 21 contains at least one material selected from the group consisting of, for example, aluminum (Al), copper (Cu), tungsten (W), titanium (Ti), and a nitride of such metals, but the material is not limited to the examples described above and may be any material exhibiting conductivity. FIGS. 3 and 4 illustrate a case where the plurality of conductors 21 are provided on the semiconductor substrate 20, but the configuration is not limited to thereto. For example, the conductors 21 may be provided above the semiconductor substrate 20 without being in contact with the semiconductor substrate 20.

Each one of conductors 21 has an upper surface provided with a plurality of elements 22 that respectively function as magnetoresistance effect elements MTJd. The elements 22 provided on the d of one conductor 21 are, for example, aligned along the X axis. That is, the elements 22 aligned along the X axis are commonly coupled to an upper surface of one conductor 21. The elements 22 each have, for example, a tapered shape with the lower end having a larger cross-sectional area along the XY plane than that of an upper end. The configuration of the element 22 will be described in detail later.

The elements 22 each have an upper surface provided with a structure, and the structure includes a switching element member 23 and a conductor 24. The switching element member 23 included in each of the structures is made of a material consisting of an insulator including, for example, a nitride and (or) an oxide, and contains dopant introduced by ion implantation. Dopant includes, for example, arsenic (As) or germanium (Ge). The switching element member 23 includes a first portion functioning as a switching element SELd, and a second portion not functioning as the switching element SELd. The conductor 24 included in each of the structures functions as a via VIAd that electrically couples the switching element SELd and the bit line BL.

The conductor 24 has a reverse tapered shape with a lower end having a smaller cross-sectional area along the XY plane than that of an upper end, and has a columnar structure extending along the Z axis. The switching element member 23 covers a lower surface and a side surface of the conductor 24, and has a reverse tapered shape similarly to the conductor 24. Thus, an area of the lower surface of the switching element member 23 is smaller than a cross-sectional area of the switching element member 23 along the lower surface of the conductor 24.

The upper surface of the switching element member 23 is positioned at the same height as the upper surface of the conductor 24. The lower surface of the switching element member 23 is, for example, in contact with the upper surface of the element 22. That is, in the switching element member 23, a portion in contact with the lower surface of the conductor 24 directly above the element 22 is the first portion functioning as the switching element SELd, and a portion in contact with the side surface of the conductor 24 is the second portion not functioning as the switching element SELd. In the switching element member 23, a portion in contact with the lower surface of the conductor 24 but not directly above the element 22 is included in the second portion not functioning as the switching element SELd. The cross-sectional area along the XY plane of the first portion of the switching element member 23 is smaller than that of the element 22.

The conductor 24 included in each of the structures is coupled to any one of conductors 25 aligned along the X-axis direction, each extending along the Y axis. The conductors 25 have conductivity and function as the bit lines BL. The conductors 24 aligned along the Y axis are commonly coupled to one conductor 25. The conductors 24 and 25 contain at least one material selected from the group consisting of, for example, aluminum (Al), copper (Cu), tungsten (w), titanium (Ti), and a nitride of such metals, but the material is not limited to the examples described above, and may be any material exhibiting conductivity. FIGS. 3 and 4 illustrate a case where the conductor 24 is in contact with the conductor 25, but the configuration is not limited to this. For example, each of the conductors 24 may be coupled to the conductor 25 with a conductive contact plug (not shown) interposed therebetween.

Each one of the conductors 25 has an upper surface provided with a plurality of elements 26 respectively functioning as magnetoresistance effect elements MTJu. The elements 26 provided on the upper surface of one conductor 25 are aligned, for example, along the Y axis. That is, the elements 26 aligned along the Y axis are commonly coupled to the upper surface of one conductor 25. The elements 26 each have, for example, a tapered shape with a lower end having a larger cross-sectional area along the XY plane than that of an upper end. Each element 26 has a configuration similar to the element 22.

Each one of the elements 26 has an upper surface provided with a structure, and the structure includes a switching element member 27 and a conductor 28. The switching element member 27 included in each of the structures is made of a material consisting of an insulator including, for example, a nitride and (or) an oxide, and contains dopant introduced by ion implantation. Dopant includes, for example, arsenic (As) or germanium (Ge). The switching element member 27 includes a first portion functioning as a switching element SELu, and a second portion not functioning as the switching element SELu. The conductor 28 included in each of the structures functions as a via VIAu that electrically couples the switching element SELu and the word line WLu.

The conductor 28 has a reverse tapered shape with a lower end having a smaller cross-sectional area along the XY plane than that of an upper end, and has a columnar structure extending along the Z axis. The switching element member 27 covers a lower surface and a side surface of the conductor 28, and has a reverse tapered shape similarly to the conductor 28. Thus, an area of the lower surface of the switching element member 27 is smaller than a cross-sectional area of the switching element member 27 along the lower surface of the conductor 28.

The upper surface of the switching element member 27 is positioned at the same height as the upper surface of the conductor 28. The lower surface of the switching element member 27 is, for example, in contact with the upper surface of the element 26. That is, in the switching element member 27, a portion in contact with the lower surface of the conductor 28 directly above the element 26 is the first portion functioning as the switching element SELu, and a portion in contact with the side surface of the conductor 28 is the second portion not functioning as the switching element SELu. In the switching element member 27, a portion in contact with the lower surface of the conductor 28 but not directly above the element 26 is included in the second portion not functioning as the switching element SELu. The cross-sectional area along the XY plane of the first portion of the switching element member 27 is smaller than that along the XY plane of the element 26.

The conductor 28 included in each of the structures is coupled to any one of conductors 29 aligned along Y axis, each extending along the X axis. The conductors 29 have conductivity, and function as word lines WLu. The conductors 28 aligned along the X axis are commonly coupled to one conductor 29. The conductors 28 and 29 contain at least one material selected from the group consisting of, for example, aluminum (Al), copper (Cu), tungsten (W), titanium (Ti), and a nitride of such metals, but the material is not limited to the above-described examples and may be any material exhibiting conductivity. In FIGS. 3 and 4, the conductor 28 is in contact with the conductor 29, but the configuration is not limited to this. For example, each of the conductors 28 may be coupled to the conductor 29 with a conductive contact plug (not shown) interposed therebetween.

With the above-described configuration, the memory cell array 10 attains a configuration in which a single bit line BL corresponds to a set consisting of two word lines WLd and WLu. In the memory cell array 10, the memory cell MCd is provided between the word line WLd and the bit line BL, and the memory cell MCu is provided between the bit line BL and the word line WLu. That is, the memory cell array 10 has a configuration in which a plurality of memory cells MC are provided at different heights along the Z axis. In the cell structure shown in FIGS. 3 and 4, memory cells MCd are associated with lower layers, and memory cells MCu are associated with upper layers. That is, of two memory cells MC commonly coupled to a single bit line BL, a memory cell MC provided in layers above the bit line BL corresponds to a memory cell MCu to which the suffix "u" is added, and a memory cell MC provided in layers below the bit line BL corresponds to a memory cell MCd to which the suffix "d" is added.

1.1.3 Magnetoresistance Effect Element

Next, a configuration of the magnetoresistance effect element of the magnetic memory device according to the first embodiment will be described with reference to FIG. 5. FIG. 5 is a cross-sectional view illustrating a configuration of the magnetoresistance effect element of the magnetic memory device according to the embodiment. FIG. 5 shows an example of a cross section of the magnetoresistance effect element MTJ shown in, for example, FIGS. 3 and 4, cut along a plane perpendicular to the Z axis (e.g., XZ plane).

As shown in FIG. 5, the magnetoresistance effect element MTJ includes, for example, a ferromagnet 31 functioning as a storage layer SL, a nonmagnet 32 functioning as a tunnel barrier layer TB, a ferromagnet 33 functioning as a reference layer RL, a nonmagnet 34 functioning as a spacer layer SP, and a ferromagnet 35 functioning as a shift cancelling layer SCL.

The magnetoresistance effect element MTJ includes, for example, a plurality of films stacked in the order of, from the word line WLd side toward the bit line BL side (or from the bit line BL side toward the word line WLu side), the ferromagnet 35, the nonmagnet 34, the ferromagnet 33, the nonmagnet 32, and the ferromagnet 31. The magnetoresistance effect element MTJ functions as, for example, a perpendicular-magnetization type MTJ element in which a magnetization direction of magnets constituting the magnetoresistance effect element MTJ is perpendicular to the film surface. The magnetoresistance effect element MTJ may further include layers (not shown) between the layers 31-35.

The ferromagnet 31 has ferromagnetic properties, and has an easy axis of magnetization in a direction perpendicular to the film plane. The ferromagnet 31 has a magnetization directed toward either the bit lines BL or the word lines WL along the Z axis. The ferromagnet 31 contains at least one of iron (Fe), cobalt (Co), or nickel (Ni). The ferromagnet 31 may further contain boron (B). More specifically, the ferromagnet 31 may contain, for example, iron cobalt boron (FeCoB) or iron boron (FeB), and have a body-centered crystal structure.

The nonmagnet 32 is a non-magnetic insulator, and contains magnesium oxide (MgO), for example. The nonmagnet 32 has an NaCl crystal structure with a film plane oriented in a (001) plane, and functions as a seed material serving as a nucleus for growth of a crystalline film from an interface with the ferromagnet 31 during a crystallization process of the ferromagnet 31. The nonmagnet 32 is provided between the ferromagnet 31 and the ferromagnet 33, and forms, together with these two ferromagnets, a magnetic tunnel junction.

The ferromagnet 33 has ferromagnetic properties, and has an easy axis of magnetization in a direction perpendicular to the film plane. The ferromagnet 33 has a magnetization direction toward either the bit line BL side or the word line WL side along the Z axis. The ferromagnet 33 contains, for example, at least one of iron (Fe), cobalt (Co), or nickel (Ni). The ferromagnet 33 may further contain boron (B). More specifically, the ferromagnet 33 may contain, for example, iron cobalt boron (FeCoB) or iron boron (FeB), and have a body-centered crystal structure. The magnetization direction of the ferromagnet 33 is fixed, and is toward the direction of the ferromagnet 35 in the example of FIG. 5. In the description, "magnetization direction is fixed" means that the magnetization direction is not changed by a current (spin torque) large enough to reverse the magnetization direction of the ferromagnet 31.

The ferromagnet 33 may be a layer stack including a plurality of layers, although this is not illustrated in FIG. 5. Specifically, a layer stack that constitutes the ferromagnet 33 may have, for example, a structure including a layer containing the aforementioned iron cobalt boron (FeCoB) or iron boron (FeB) as an interface layer with the nonmagnet 32, and including an additional ferromagnet stacked between the interface layer and the nonmagnet 34 with a nonmagnetic conductor interposed therebetween. The nonmagnetic conductor in the layer stack that constitutes the ferromagnet 33 may contain at least one metal selected from the group consisting of, for example, tantalum (Ta), hafnium (Hf), tungsten (W), zirconium (Zr), molybdenum (Mo), niobium (Nb), and titanium (Ti). The additional ferromagnet in the layer stack that constitutes the ferromagnet 33 may contain at least one multilayer film selected from the group consisting of, for example, a multilayer film of cobalt (Co) and platinum (Pt) (Co/Pt multilayer film), a multilayer film of cobalt (Co) and nickel (Ni) (Co/Ni multilayer film), and a multilayer film of cobalt (Co) and palladium (Pd) (Co/Pd multilayer film).

The nonmagnet 34 is a non-magnetic conductor, and contains at least one element selected from the group consisting of, for example, ruthenium (Ru), osmium (Os), iridium (Ir), vanadium (V), and chromium (Cr).

The ferromagnet 35 has ferromagnetic properties, and has an easy axis of magnetization in a direction perpendicular to the film plane. The ferromagnet 35 has a magnetization directed toward either the bit lines BL or the word lines WL along the Z axis. The magnetization direction of the ferromagnet 35 is fixed, similarly to the ferromagnet 33, and is toward the direction of the ferromagnet 33 in the example of FIG. 5. The ferromagnet 35 contains at least one alloy selected from the group consisting of, for example, cobalt platinum (CoPt), cobalt nickel (CoNi), and cobalt palladium (CoPd). The ferromagnet 35 may be a layer stack including a plurality of layers, similarly to the ferromagnet 33. In this case, the ferromagnet 35 may contain at least one multilayer film selected from the group consisting of, for example, a multilayer film of cobalt (Co) and platinum (Pt) (Co/Pt multilayer film), a multilayer film of cobalt (Co) and nickel (Ni) (Co/Ni multilayer film), and a multilayer film of cobalt (Co) and palladium (Pa) (Co/Pa multilayer film).

The ferromagnets 33 and 35 are antiferromagnetically coupled by the nonmagnet 34. That is, the ferromagnets 33 and 35 are coupled in such a manner that their magnetization directions are anti-parallel to each other. Accordingly, the magnetization directions of the ferromagnets 33 and 35 are opposite to each other in the example of FIG. 5. Such a coupling structure of the ferromagnet 33, the nonmagnet 34, and the ferromagnet 35 is referred to as a synthetic antiferromagnetic (SAF) structure. With this structure, the ferromagnet 35 can cancel out the influence of the stray field of the ferromagnet 33 on the magnetization direction of the ferromagnet 31. Thus, it is possible to prevent asymmetry from occurring in the ease of rotation of the magnetization direction of the ferromagnet 31, due to, e.g., a leak field of the ferromagnet 33 (that is, prevent the ease of reversal of the magnetization direction of the ferromagnet 31 from differing between the case of reversing from one side to the other and the case of reversing in the opposite direction).

The first embodiment adopts a spin injection write technique, in which a write current is allowed to directly flow through the magnetoresistance effect element MTJ, and a spin torque is injected into the storage layer SL and the reference layer RL by the write current, thereby controlling the magnetization directions of the storage layer SL and the reference layer RL. The magnetoresistance effect element MTJ may take either a low-resistance state or a high-resistance state, according to whether the relative relationship between the magnetization direction of the storage layer SL and the magnetization direction of the reference layer RL is parallel or antiparallel.

When write current Ic0 of a magnitude is allowed to flow through the magnetoresistance effect element MTJ in the direction of the arrow A1 in FIG. 5, namely, the direction from the storage layer SL toward the reference layer RL, the relative relationship between the magnetization direction of the storage layer SL and the magnetization direction of the reference layer RL becomes parallel. In this parallel state, the magnetoresistance effect element MTJ has the least resistance value, and the magnetoresistance effect element MTJ is set to a low-resistance state. This low-resistance state is called a "P (parallel) state" and defined as a state of data "0".

When write current Ic1, greater than the write current Ic0, is allowed to flow through the magnetoresistance effect element MTJ in the direction of the arrow A2 in FIG. 5, namely, the direction from the reference layer RL toward the storage layer SL (opposite to the arrow A1), the relative relationship between the magnetization directions of the storage layer SL and the reference layer RL becomes anti-parallel. In this anti-parallel state, resistance of the magnetoresistance effect element MTJ takes the maximum value, and the magnetoresistance effect element MTJ is set to a high-resistance state. This high-resistance state is called an "anti-parallel (AP) state", and defined as, for example, the state of data "1".

A description will be given below in accordance with the above-described definition of data; however, the definition of data "1" and data "0" is not limited thereto. For example, the P state may be defined as data "1", and the AP state may be defined as data "0".

1.2 Manufacturing Method

Next, a method of manufacturing the memory cell array of the magnetic memory device according to the first embodiment will be described with reference to FIGS. 6 to 10. FIGS. 6 to 10 show the processes up to the forming of the bit line BL in the memory cell array 10 (i.e., up to forming of the memory cell MCd, of the memory cells MCd and MCu stacked along the Z axis). FIGS. 6 to 10 each include upper section (A), showing a top view of the semiconductor substrate 20 viewed from above, and lower section (B), showing a cross-section view along the XZ plane.

Figure 6:
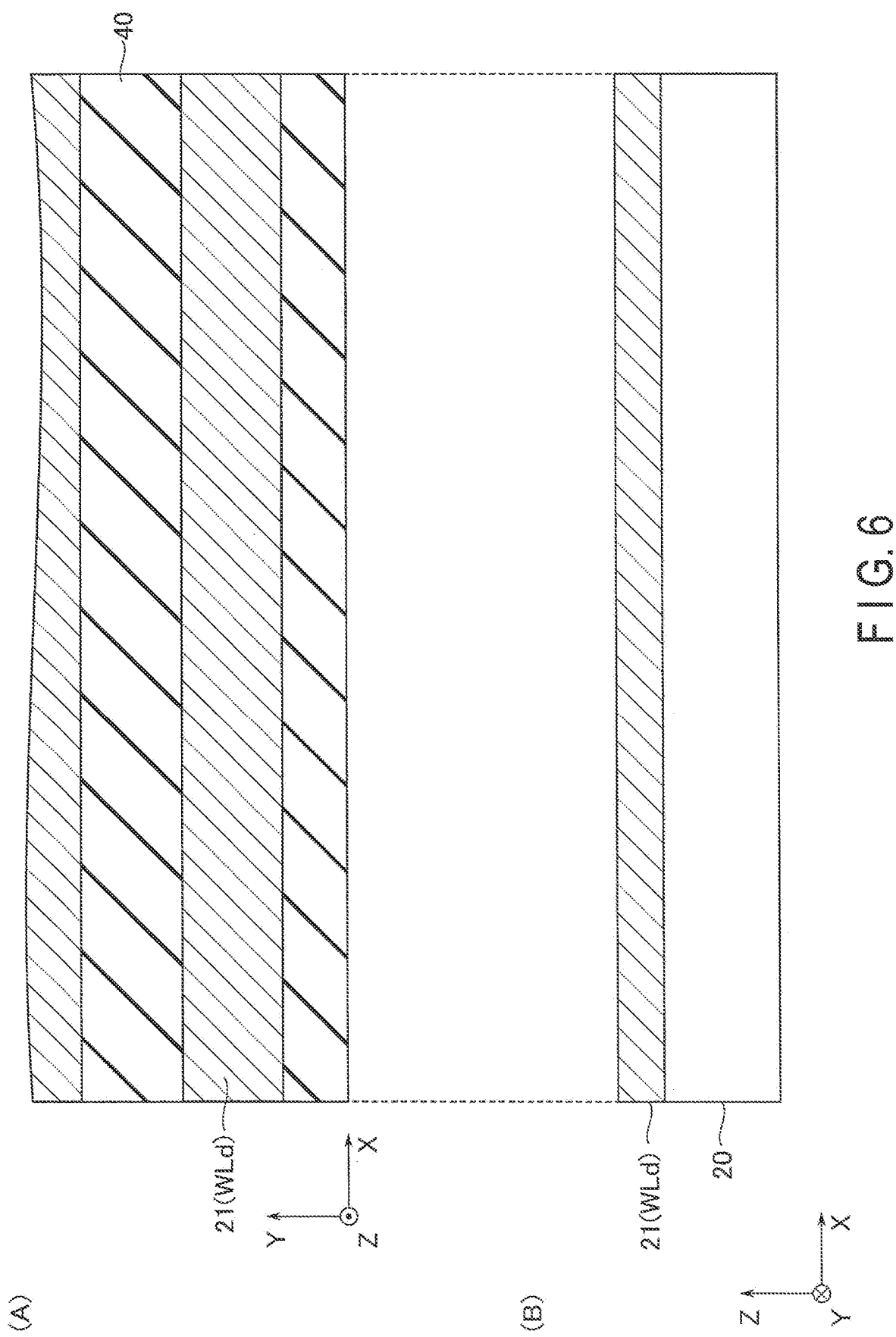
FIG. 6 is a schematic diagram illustrating a method of manufacturing the memory cell array of the magnetic memory device according to the first embodiment.

As shown in FIG. 6, a conductive layer is formed on the upper surface of the semiconductor substrate 20. The conductive layer is removed by, for example, photolithography and anisotropic etching, except for portions that are to function as the word lines WLd. Thereby, conductors 21 are formed, each extending along the X axis and aligned along the Y axis. The anisotropic etching used in the process of FIG. 6 is, for example, reactive ion etching (RIE). An insulator 40 is provided between the conductors 21. With this, the conductors 21 are insulated from each other.

Figure 7:
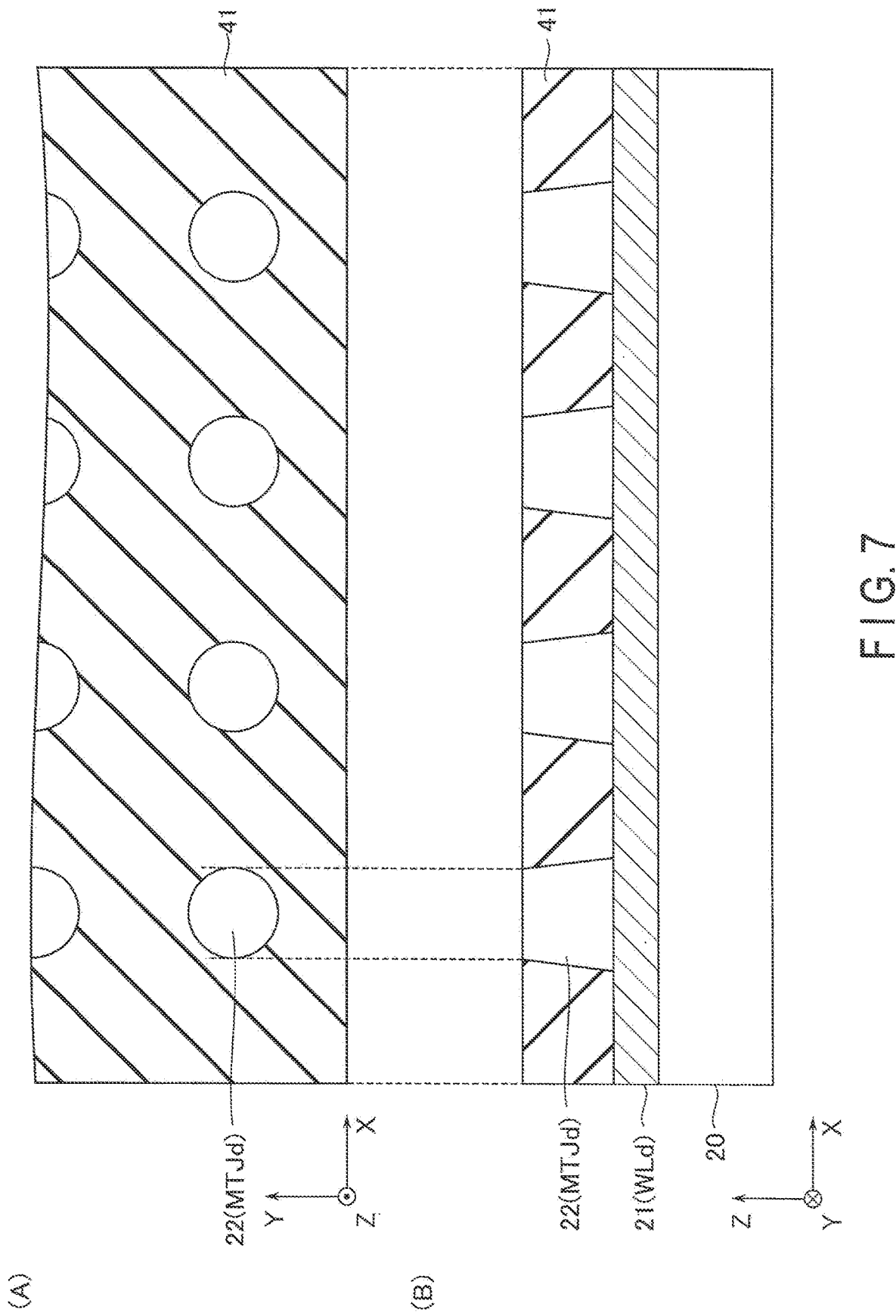
FIG. 7 is a schematic diagram illustrating the method of manufacturing the memory cell array of the magnetic memory device according to the first embodiment.

Next, a magnetoresistance effect element layer is provided throughout the surface as illustrated in FIG. 7. The magnetoresistance effect element layer is a structure in which layers constituting the magnetoresistance effect element MTJ are stacked in order as described with reference to FIG. 5. The magnetoresistance effect element layer is removed by, for example, photolithography and anisotropic etching, except for portions that are to function as magnetoresistance effect elements MTJd. Thereby, elements 22 aligned in a matrix pattern are formed. In the example of FIG. 7, the element 22 has a columnar shape, but the shape is not limited to this, and may be prismatic. The anisotropic etching used in the process of FIG. 7 is, for example, ion beam etching (IBE). An insulator 41 is provided between the elements 22. With this, the elements 22 are insulated from each other.

Figure 8:
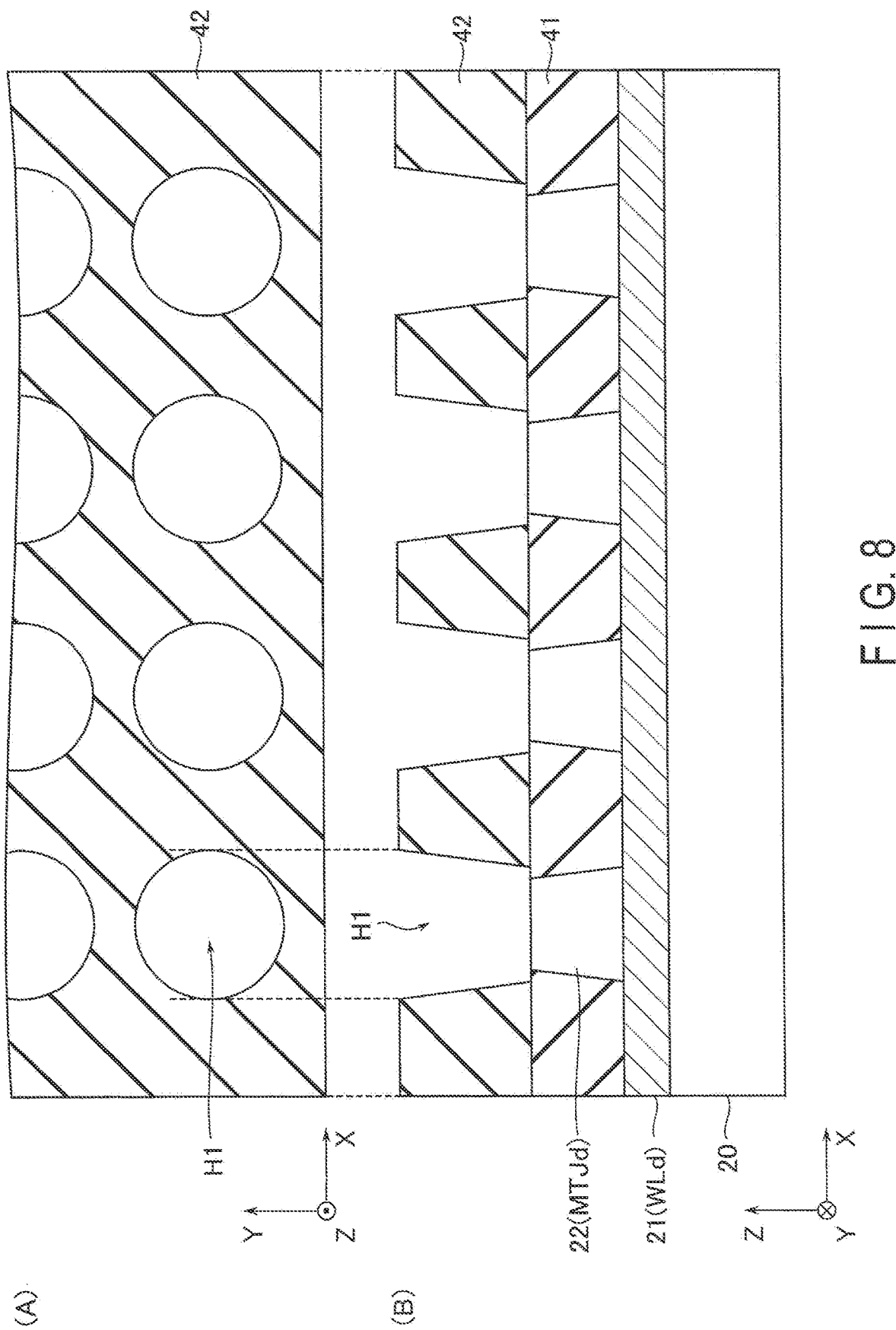
FIG. 8 is a schematic diagram illustrating the method of manufacturing the memory cell array of the magnetic memory device according to the first embodiment.

Next, an insulating layer 42 is provided throughout the surface as illustrated in FIG. 8. In the insulating layer 42, portions where the switching element member 23 and the conductor 24 are to be provided are selectively removed by, for example, photolithography and anisotropic etching. Thereby, a plurality of holes H1 are formed in the insulating layer 42. At lower ends of the holes H1, upper surfaces of corresponding elements 22 are exposed. The anisotropic etching used in the process of FIG. 8 is, for example, RIE. By adjusting etching processing conditions, the hole H1 is formed to have a reverse tapered shape in which an area of the lower surface (surface at which the element 22 is exposed) is smaller than that of the opening.

Next, a switching element layer and a conductive layer are provided throughout the surface as illustrated in FIG. 9. The switching element layer covers the side surface and the lower surface of each of the holes H1. The conductive layer is provided on the upper surface of the switching element layer and filled into the holes H1. Subsequently, the switching element layer and the conductive layer are planarized by, for example, chemical mechanical polishing (CMP), and a part above the insulating layer 42 is removed. Thereby, the switching element layer and the conductive layer are divided into parts provided in each of the holes H1 (i.e., structures each including the switching element member 23 and the conductor 24). As described above, since the hole H1 is formed to have a reverse tapered shape, the switching element member 23 and the conductor 24 also have a reverse tapered shape. Accordingly, a cross-sectional area S2 along the XY plane of the first portion of the switching element member 23 (e.g., in FIG. 9, a shade-hatched region in a region surrounded by a dashed-dotted line) is smaller than a cross-sectional area S1 along the XY plane of the element 22 (e.g., in FIG. 9, the region surrounded by the dashed-dotted line).

Figure 10:
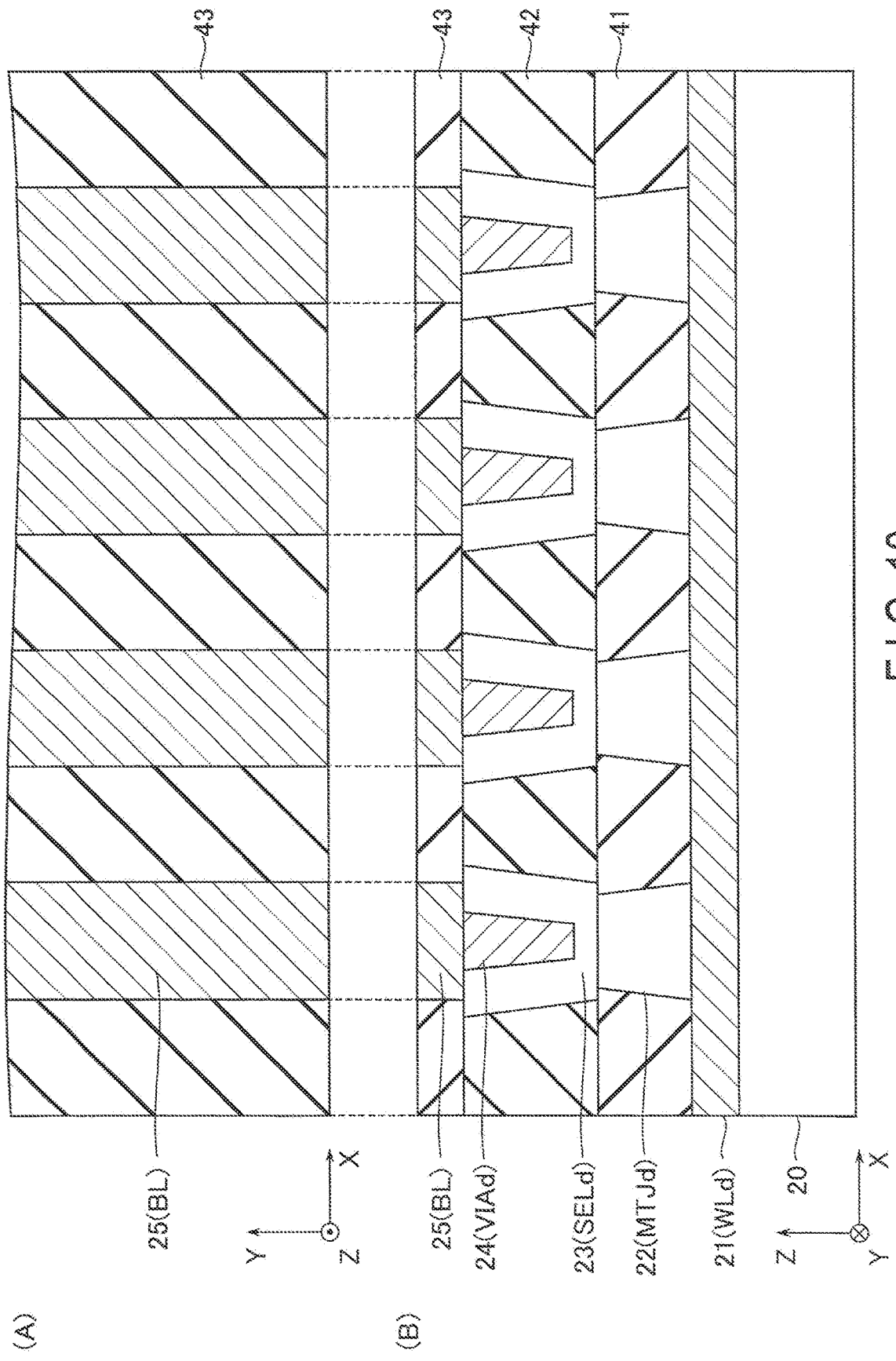
FIG. 10 is a schematic diagram illustrating the method of manufacturing the memory cell array of the magnetic memory device according to the first embodiment.

Next, a conductive layer is provided throughout the surface as illustrated in FIG. 10. The conductive layer is removed by, for example, photolithography and anisotropic etching, except for portions that are to function as the bit lines BL. Thereby, conductors 25 are formed, each extending along the Y axis and aligned along the X axis. The anisotropic etching used in the process of FIG. 10 is, for example, RIE. An insulator 43 is provided between the conductors 25. With this, the conductors 25 are insulated from each other.

Accordingly, a portion corresponding to the memory cell MCd of the memory cell array 10 is provided. A portion corresponding to the memory cell MCu can be provided by repeating the processes of FIGS. 7 to 10 described above.

1.3 Advantageous Effects of Present Embodiment

According to the first embodiment, the structure including the switching element member 23 and the conductor 24 is provided above the element 22 functioning as the magnetoresistance effect element MTJ. The switching element member 23 includes the first portion in contact with the lower surface of the conductor 24 directly above the element 22, and the second portion in contact with the side surface of the conductor 24. With this configuration, in the switching element member 23, only the first portion can function as the switching element SEL. Therefore, the cross-sectional area of the switching element member 23 can be suppressed to approximately area S2 of the lower surface of the conductor 24. Accordingly, it is possible to suppress an increase in the cross-sectional area of the switching element SEL, and to reduce a probability of occurrence of a short circuit defect in the switching element SEL.

As a supplemental note, when the switching element SEL is short-circuited, not only the memory cell MC including the short-circuited switching element SEL but also all of the memory cells MC coupled in parallel to the word line WL or bit line BL with the short-circuited switching element SEL are unable to be selected. Thus, it is desirable, to the greatest extent possible, to avoid causing a failure mode in which the switching element SEL is short-circuited. The short circuit in the switching element SEL results from pinholes or granular impurities (particles) generated in the switching element member. It is considered that pinholes or particles are generated in the layer with a given probability according to conditions of the manufacturing processes, and a probability of causing the short circuit in the switching element SEL may be proportional to the size of the cross-sectional area along the XY plane of the switching element member.

According to the first embodiment, after the elements 22 are formed, the insulating layer 42 is formed throughout the surface, and the holes H1 are formed in the insulating layer 42. Then, inside the hole H1, the switching element member 23 and the conductor 24 are formed in this order. Thus, the area of the lower surface of the conductor 24 facing the element 22 can be made smaller than the area of the upper surface of the element 22. Accordingly, in the switching element member 23 formed between the element 22 and the conductor 24, the portion functioning as the switching element SEL can be limited to the region that is in contact with the lower surface of the conductor 24. Accordingly, it is possible to suppress an increase in the cross-sectional area of the switching element SEL, and to reduce a probability of occurrence of a short circuit defect in the switching element SEL.

The hole H1 is formed to have a reverse tapered shape in which the area of the lower surface is smaller than that of the opening. Thus, the area of the lower surface of the conductor 24 is made smaller than that of the upper surface of the conductor 24. Accordingly, it is possible to suppress an increase in the cross-sectional area of the first portion of the switching element member 23.

Further, the area of the lower surface of the conductor 24 is smaller than that of the upper surface of the element 22. As described, the element 22 is formed to have a tapered shape in which the area of the lower surface is larger than that of the upper surface. Thus, the cross-sectional area of the switching element SEL is made smaller than that of the at least element 22. Therefore, assuming that pinholes or particles are caused in the element 22 with a similar probability to the switching element member 23, a probability of occurrence of the short circuit defect in the switching element SEL can be lower than that in the magnetoresistance effect element MTJ.

The holes H1 are provided for the respective elements 22 in the insulating layer 42. Thereby, the switching element SEL and the via VIA are separately formed for each memory cell MC. In this case, by forming the conductor 25 commonly coupled to the plurality of conductors 24 above the switching element member 23 and the conductor 24, the conductor 25 functions as the bit line BL. Therefore, the memory cells MC in the memory cell array 10 can be uniquely associated with a set of the bit line BL and the word line WL.

2. Second Embodiment

Next, a magnetic memory device according to a second embodiment will be described. The second embodiment differs from the first embodiment in that the switching element member is shared by multiple elements 22. Hereinafter, the description for the same configurations and operations as those of the first embodiment will be omitted, and those differing from those of the first embodiment will be mainly described.

2.1 Configuration of Memory Cell Array

Figure 11:
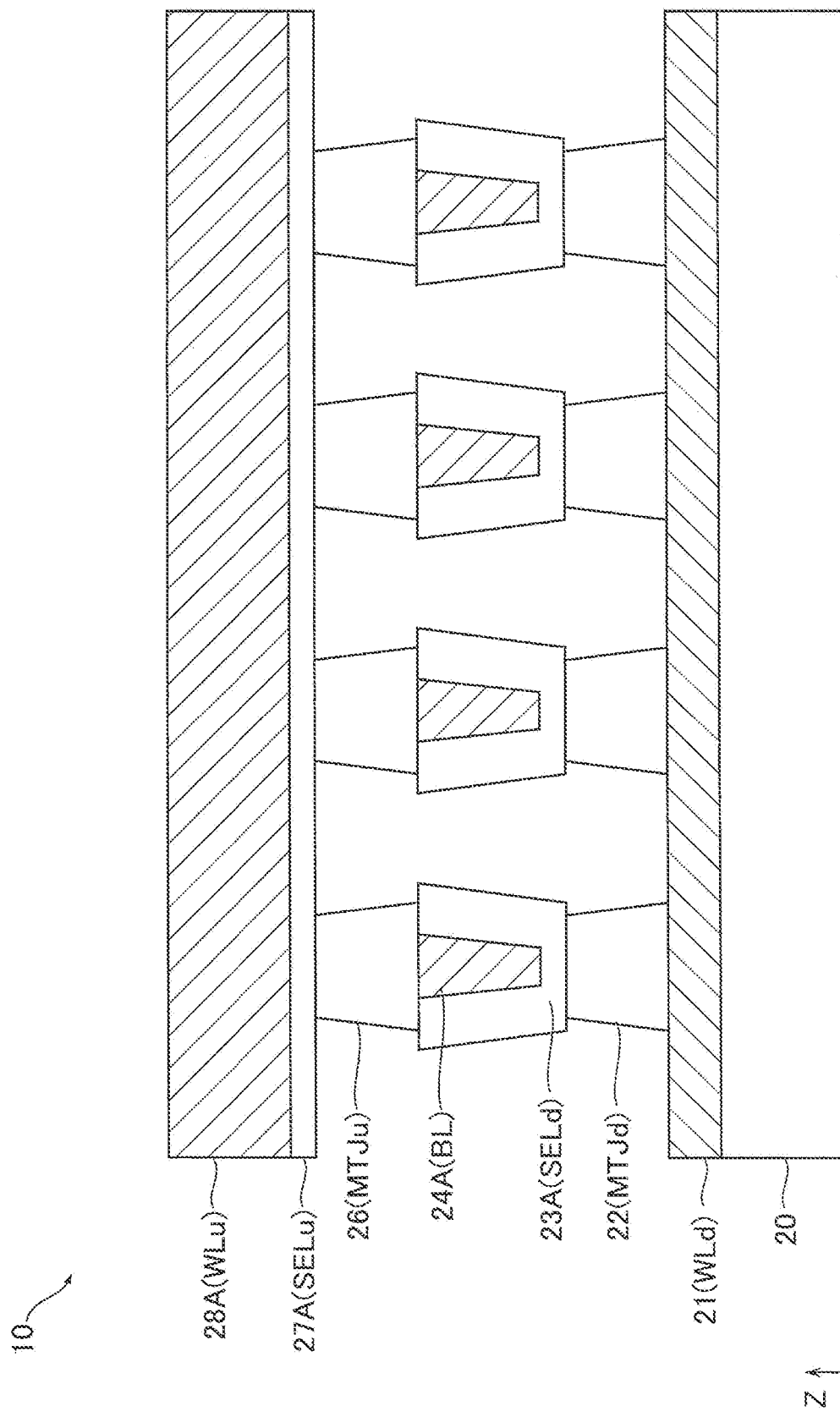
FIG. 11 is a cross-sectional view illustrating a configuration of a memory cell array of a magnetic memory device according to a second embodiment.
Figure 12:
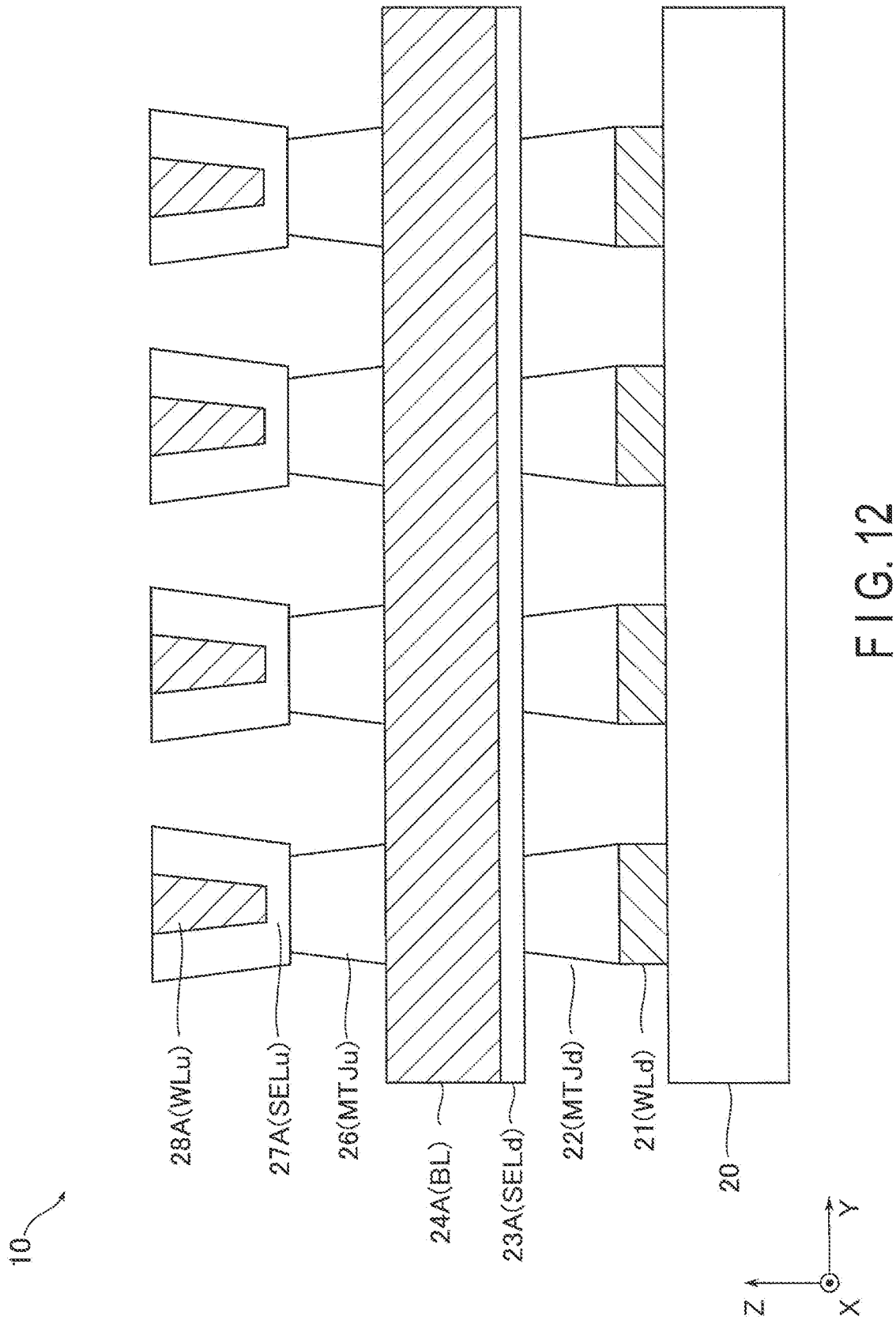
FIG. 12 is a cross-sectional view illustrating the configuration of the memory cell array of the magnetic memory device according to the second embodiment.

FIGS. 11 and 12 each show an example of a cross-sectional view illustrating a configuration of a memory cell array of a magnetic memory device according to the second embodiment, and correspond to FIGS. 3 and 4, respectively, of the first embodiment.

As shown in FIGS. 11 and 12, on an upper surface of a layer provided with the elements 22, a plurality of structures each including a switching element member 23A and a conductor 24A are provided, each extending along the Y axis and aligned along the X axis. Each of the structures is provided on a set of elements 22 aligned along the Y axis. The switching element member 23A included in each of the structures includes a plurality of first portions respectively functioning as switching elements SELd coupled in series to the corresponding elements 22, and a second portion not functioning as the switching element SELd. The conductor 24A included in each of the structures functions as a bit line BL electrically coupled to switching elements SELd in the switching element member 23A.

The conductor 24A has a reverse tapered shape with a lower end having a smaller width along the X axis than that of an upper end. The switching element member 23A covers a lower surface and a side surface of the conductor 24A, and has a reverse tapered shape similarly to the conductor 24A. The upper surface of the switching element member 23A is positioned at the same height as the upper surface of the conductor 24A. The lower surface of the switching element member 23A is, for example, in contact with the upper surface of each of the corresponding elements 22. That is, in the switching element member 23A, a portion in contact with the lower surface of the conductor 24A directly above each of the elements 22 is the first portion functioning as the switching element SELd, and a portion in contact with the side surface of the conductor 24A is the second portion not functioning as the switching element SELd. In the switching element member 23A, a portion in contact with the lower surface of the conductor 24 but not directly above each of the elements 22 is included in the second portion not functioning as the switching element SELd. The cross-sectional area along the XY plane of the first portion of the switching element member 23A is smaller than the cross-sectional area along the XY plane of the element 22.

Each one of the conductors 24A has an upper surface provided with a plurality of elements 26 which respectively function as magnetoresistance effect elements MTJu. The elements 26 provided on the upper surface of one conductor 24A are, for example, aligned along the Y axis. That is, the elements 26 aligned along the Y axis are commonly coupled to the upper surface of one single conductor 24A.

The upper surface of the layer provided with the elements 26 is provided with a plurality of structures each including a switching element member 27A and a conductor 28A, and the structures extend along the X axis and are aligned along the Y axis. Each of the structures is provided on a set of elements 26 aligned along the X axis. The switching element member 27A included in each of the structures includes a plurality of first portions respectively functioning as switching elements SELu coupled in series to the corresponding elements 26, and a second portion not functioning as the switching element SELu. A conductor 28A included in each of the structures functions as a word line WLu electrically coupled to the switching elements SELu in the switching element member 27A.

The conductor 28A has a reverse tapered shape with a lower end having a smaller width along the X axis than that of an upper end. The switching element member 27A covers a lower surface and a side surface of the conductor 28A, and has a reverse tapered shape similarly to the conductor 28A. The upper surface of the switching element member 27A is positioned at the same height as that of the upper surface of the conductor 28A. The lower surface of the switching element member 27A is, for example, in contact with the upper surface of each of the corresponding elements 22. That is, in the switching element member 27A, a portion in contact with the lower surface of the conductor 28A directly above each of the elements 26 is the first portion functioning as the switching element SELu, and a portion in contact with the side surface of the conductor 28A is the second portion not functioning as the switching element SELu. In the switching element member 27A, a portion in contact with the lower surface of the conductor 28 but not directly above each of the corresponding elements 26 is included in the second portion not functioning as the switching element SELu. The cross-sectional area along the XY plane of the first portion of the switching element member 27A is smaller than the cross-sectional area along the XY plane of the element 26.

2.2 Method of Manufacturing Memory Cell Array

Figure 13:
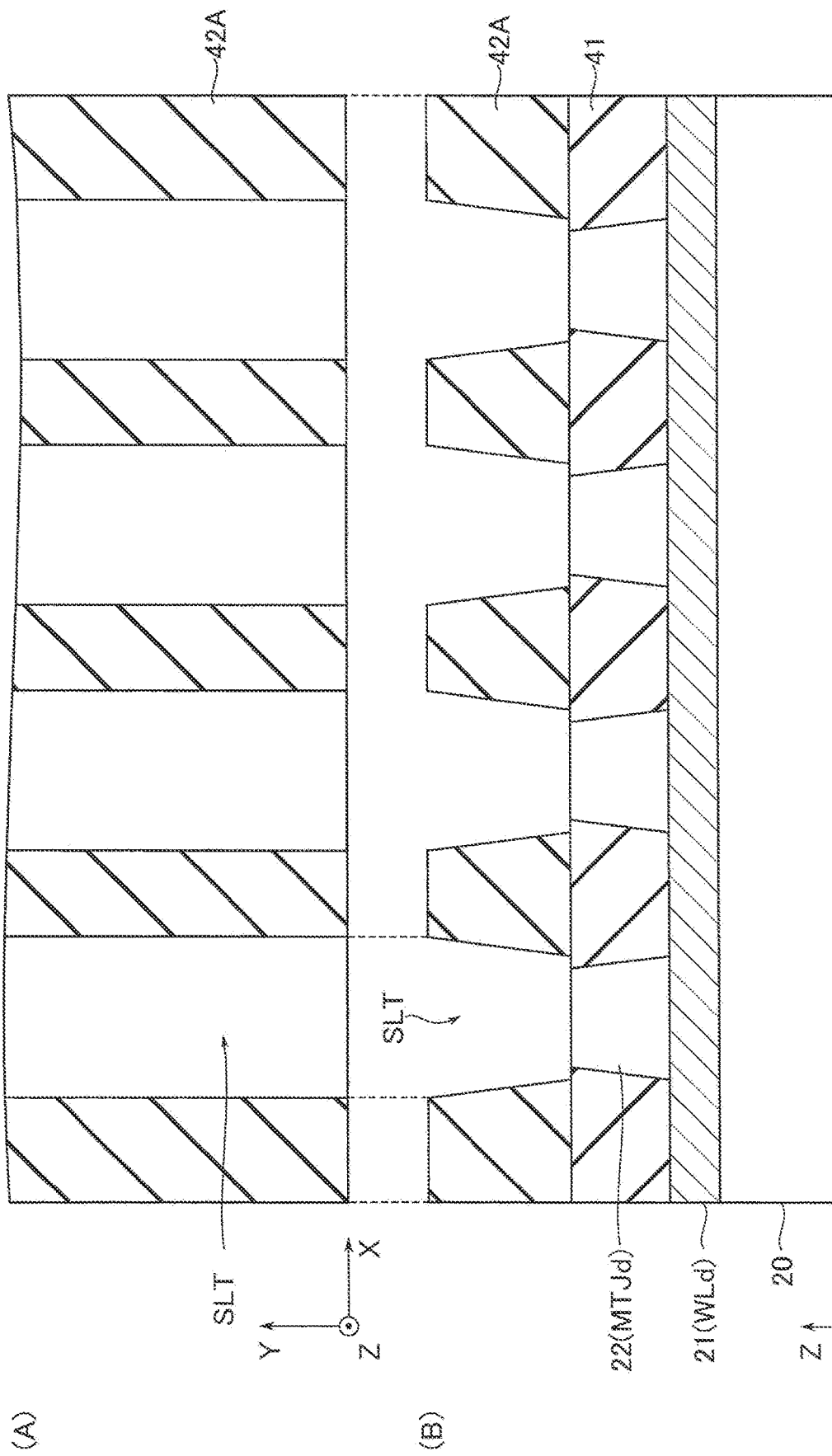
FIG. 13 is a schematic diagram illustrating a method of manufacturing the memory cell array of the magnetic memory device according to the second embodiment.
Figure 14:
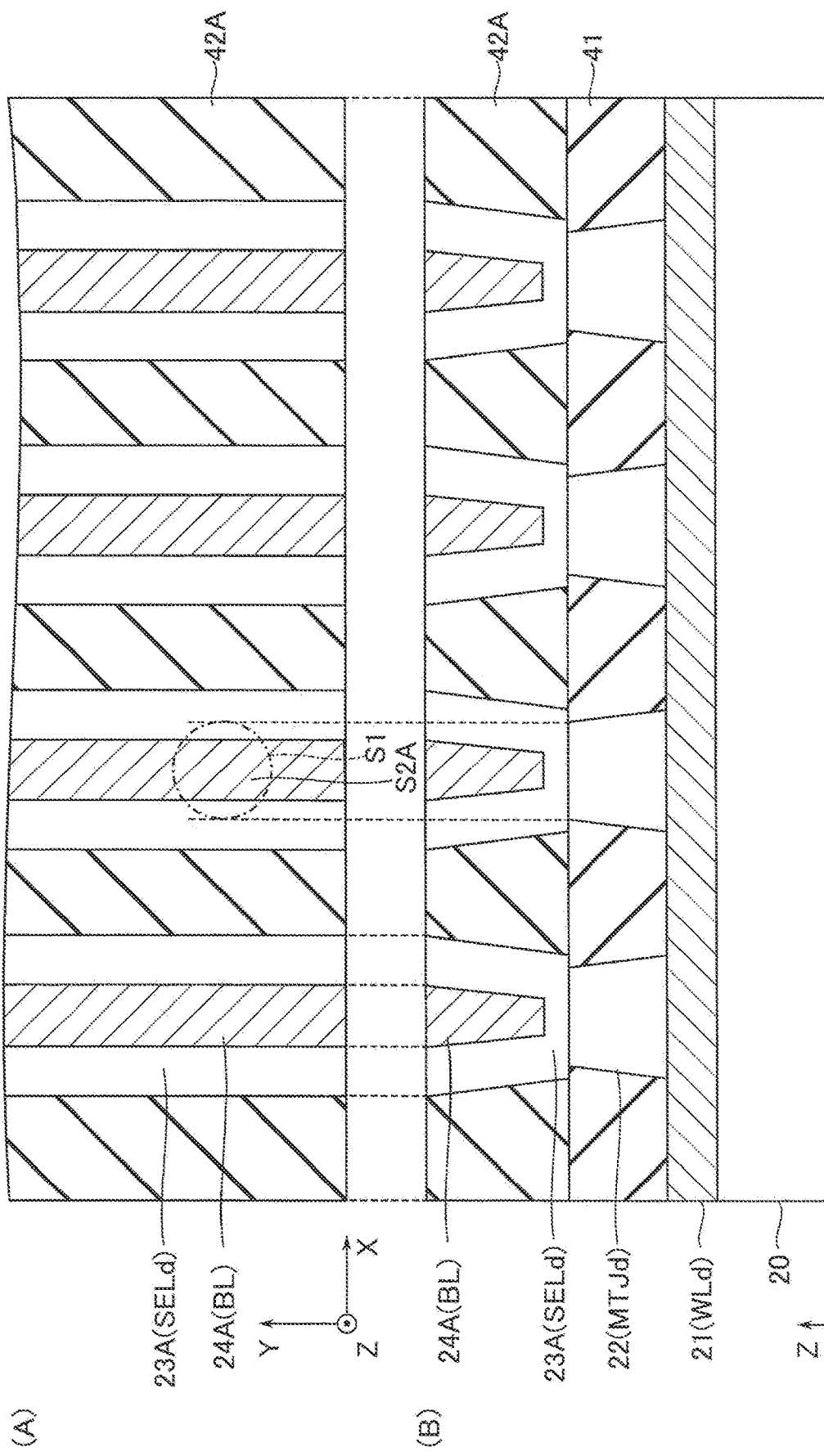
FIG. 14 is a schematic diagram illustrating the method of manufacturing the memory cell array of the magnetic memory device according to the second embodiment.

Next, a method of manufacturing the memory cell array of the magnetic memory device according to the second embodiment will be described with reference to FIGS. 13 and 14. FIGS. 13 and 14 correspond to FIGS. 8 and 9, respectively, of the first embodiment, and show the processes up to the forming of the switching element member 23A and the conductor 24A after the element 22 is formed, in the memory cell array 10.

First, by the processes as in FIGS. 6 and 7 of the first embodiment, conductors 21 and elements 22 are provided on the semiconductor substrate 20.

Next, an insulating layer 42A is provided throughout the surface as illustrated in FIG. 13. In the insulating layer 42A, portions where the switching element member 23A and the conductor 24A are to be provided are selectively removed by, for example, photolithography and anisotropic etching. Thereby, a plurality of slits SLT are formed in the insulating layer 42A. At lower ends of the slits SLT, upper surfaces of corresponding elements 22 are exposed. The anisotropic etching used in the process of FIG. 13 is, for example, RIE. By adjusting the etching processing conditions, the slits SLT are formed to have a reverse tapered shape in which areas of lower ends (i.e., surfaces at which elements 22 are exposed) are smaller than areas of openings.

Next, a switching element layer and a conductive layer are provided throughout the surface as illustrated in FIG. 14. The switching element layer covers the side surface and the lower surface of each of the slits SLT. The conductive layer is provided on the upper surface of the switching element layer and filled in the slits SLT. Subsequently, the switching element layer and the conductive layer are planarized by, for example, CMP, and a part above the insulating layer 42A is removed. Thereby, the switching element layer and the conductive layer are divided into parts provided in each of the slits SLT (i.e., structures each including the switching element member 23A and the conductor 24A). As described above, since the slit SLT is formed to have a reverse tapered shape, the switching element member 23A and the conductor 24A also have a reverse tapered shape. Accordingly, a cross-sectional area S2A along the XY plane of the first portion of the switching element member 23A (in FIG. 13, a shade-hatched region in a region surrounded by a dashed-dotted line) is smaller than a cross-sectional area S1 along the XY plane of the element 22 (in FIG. 13, the region surrounded by the dashed-dotted line).

In this manner, a portion corresponding to the memory cell MCd of the memory cell array 10 is provided. A portion corresponding to the memory cell MCu can be provided by repeating the processes of FIGS. 13 and 14 described above.

2.3 Advantageous Effect of Present Embodiment

According to the second embodiment, one structure including the switching element member 23A and the conductor 24A is provided above the plurality of elements 22 aligned along the Y axis. The switching element member 23A includes the first portions in contact with the lower surface of the conductor 24A directly above the corresponding elements 22, and the second portion in contact with the side surface of the conductor 24A. With this configuration, in the switching element member 23, the first portions can function as the switching elements SEL in the corresponding memory cells MC. Thus, the cross-sectional area of the switching element member 23A can be suppressed to approximately area S2A of the lower surface of the conductor 24A directly above the corresponding element 22. Accordingly, it is possible to suppress an increase in the cross-sectional area of the switching element SEL, and to reduce a probability of occurrence of a short circuit defect in the switching element SEL.

The slit SLT is formed to have a reverse tapered shape in which a lower end has a width smaller than that of the opening. Thus, the area of the lower surface of the conductor 24A is made smaller than the area of the upper surface of the conductor 24A. Accordingly, it is possible to suppress an increase in the cross-sectional area of the first portion of the switching element member 23A.

Further, the area of the lower surface of the conductor 24A is smaller than the area of the upper surface of the element 22. As described, the element 22 is formed to have a tapered shape in which the area of the lower surface is larger than the area of the upper surface. Thus, the cross-sectional area of the switching element SEL is made smaller than that of the at least element 22. Therefore, a probability of occurrence of the short circuit defect in the switching element SEL can be lowered than that in the magnetoresistance effect element MTJ.

The slits SLT are provided at the same pitch as the elements 22 in the insulating layer 42A. Thus, the switching elements SELd commonly coupled to the same bit line BL can be formed in the same material.

3. Third Embodiment

Next, a magnetic memory device according to a third embodiment will be described. The third embodiment differs from the first and second embodiments in that the magnetoresistance effect element MTJ and the switching element SEL are coupled via the conductor. Hereinafter, the description for the same configurations and operations as those of the first embodiment will be omitted, and those differing from those of the first embodiment will be mainly described.

3.1 Configuration of Memory Cell Array

Figure 15:
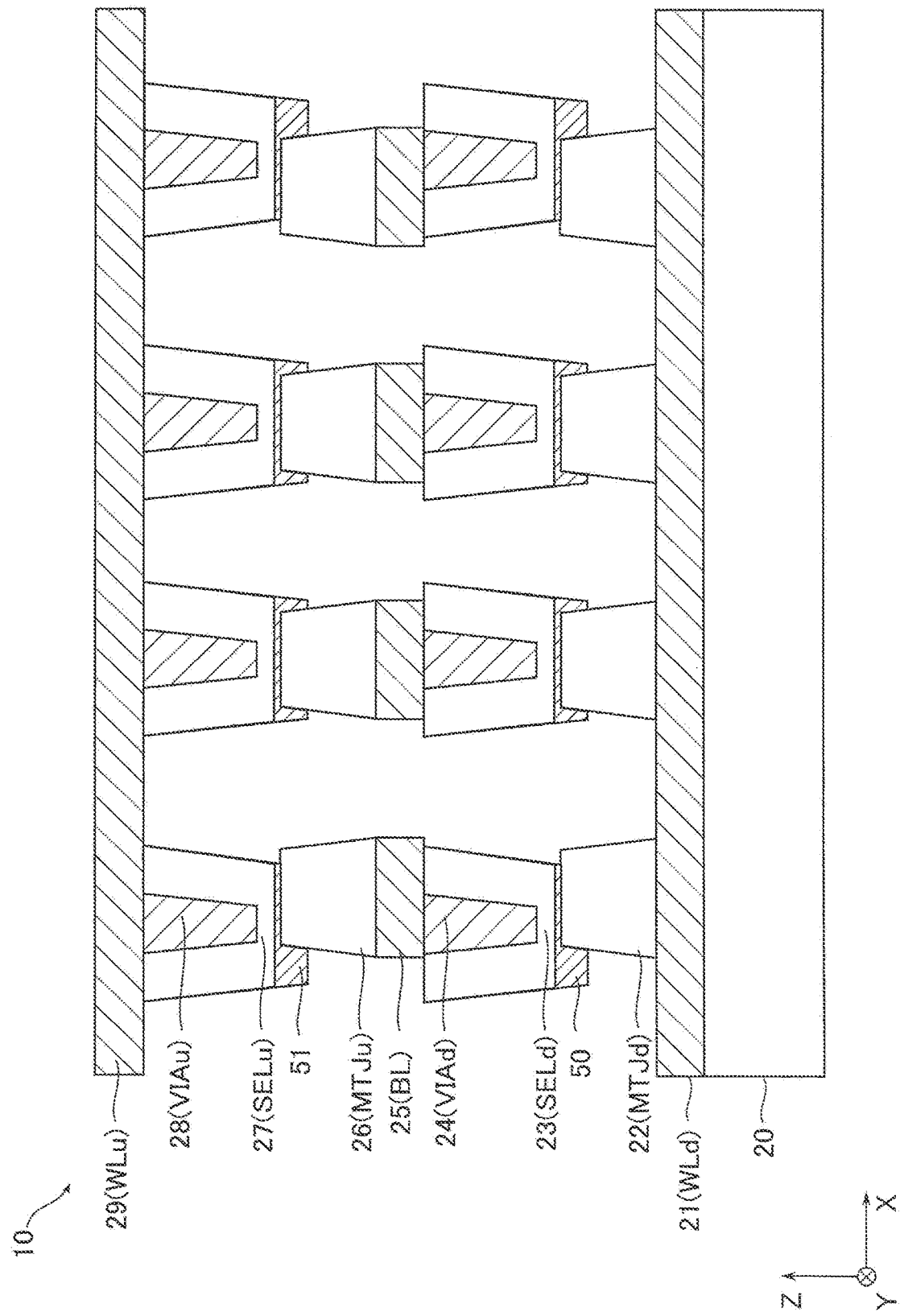
FIG. 15 is a cross-sectional view illustrating a configuration of a memory cell array of a magnetic memory device according to a third embodiment.

FIG. 15 show an example of a cross-sectional view illustrating a configuration of a memory cell array of a magnetic memory device according to the third embodiment, and correspond to FIG. 3 of the first embodiment. FIG. 15 shows a case where the axis of the structure including the switching element member 23 and the conductor 24 is eccentric with respect to the axis of the element 22, and the axis of the structure including the switching element member 27 and the conductor 28 is eccentric with respect to the axis of the element 26.

As shown in FIG. 15, a conductor 50 that electrically couples the element 22 and the switching element member 23 is provided. The conductor 50 induces a first portion between the upper surface of the element 22 and the lower surface of the switching element member 23, and a second portion in contact with the side surface of the element 22. That is, the lower surface (of the second portion) of the conductor 50 is positioned below the upper surface of the element 22, and the upper surface (of the first portion) of the conductor 50 is positioned above the upper surface of the element 22. The upper surface of the conductor 50 (i.e., the lower surface of the switching element member 23) has a height along the Z axis that remains unchanged regardless of whether it is directly above the element 22. It is desirable that the conductor 50 be a conductive material that can be selectively anisotropic-etched while exhibiting a high selection ratio with respect to the oxide film, examples of which include at least one material selected from aluminum (Al), tungsten (W), titanium (Ti), a nitride of such metals, or polysilicon.

Similarly, a conductor 51 that electrically couples the element 26 and the switching element member 27 is provided. The conductor 51 includes a first portion between the upper surface of the element 26 and the lower surface of the switching element member 27, and a second portion in contact with the side surface of the element 26. That is, the lower surface (of the second portion) of the conductor 51 is positioned below the upper surface of the element 26, and the upper surface (of the first portion) of the conductor 51 is positioned above the upper surface of the element 26. The upper surface of the conductor 51 (i.e., the lower surface of the switching element member 27) has a height along the Z axis that remains unchanged regardless of whether it is directly above the element 26. The conductor 51 includes, similarly to the conductor 50, at least one material selected from aluminum (Al), tungsten (W), titanium (Ti), a nitride of such metals, or polysilicon.

3.2 Method of Manufacturing Memory Cell Array

Next, a method of manufacturing a memory cell array of the magnetic memory device according to the third embodiment will be described with reference to FIGS. 16 to 19. FIGS. 16 to 19 correspond to FIGS. 8 and 9 in the first embodiment, and show the processes up to the forming of the conductor 50, the switching element member 23, and the conductor 24 after the element 22 is provided, in the memory cell array 10.

First, by way of the processes as in FIGS. 6 and 7 of the first embodiment, conductors 21 and elements 22 are provided on the semiconductor substrate 20.

Figure 16:
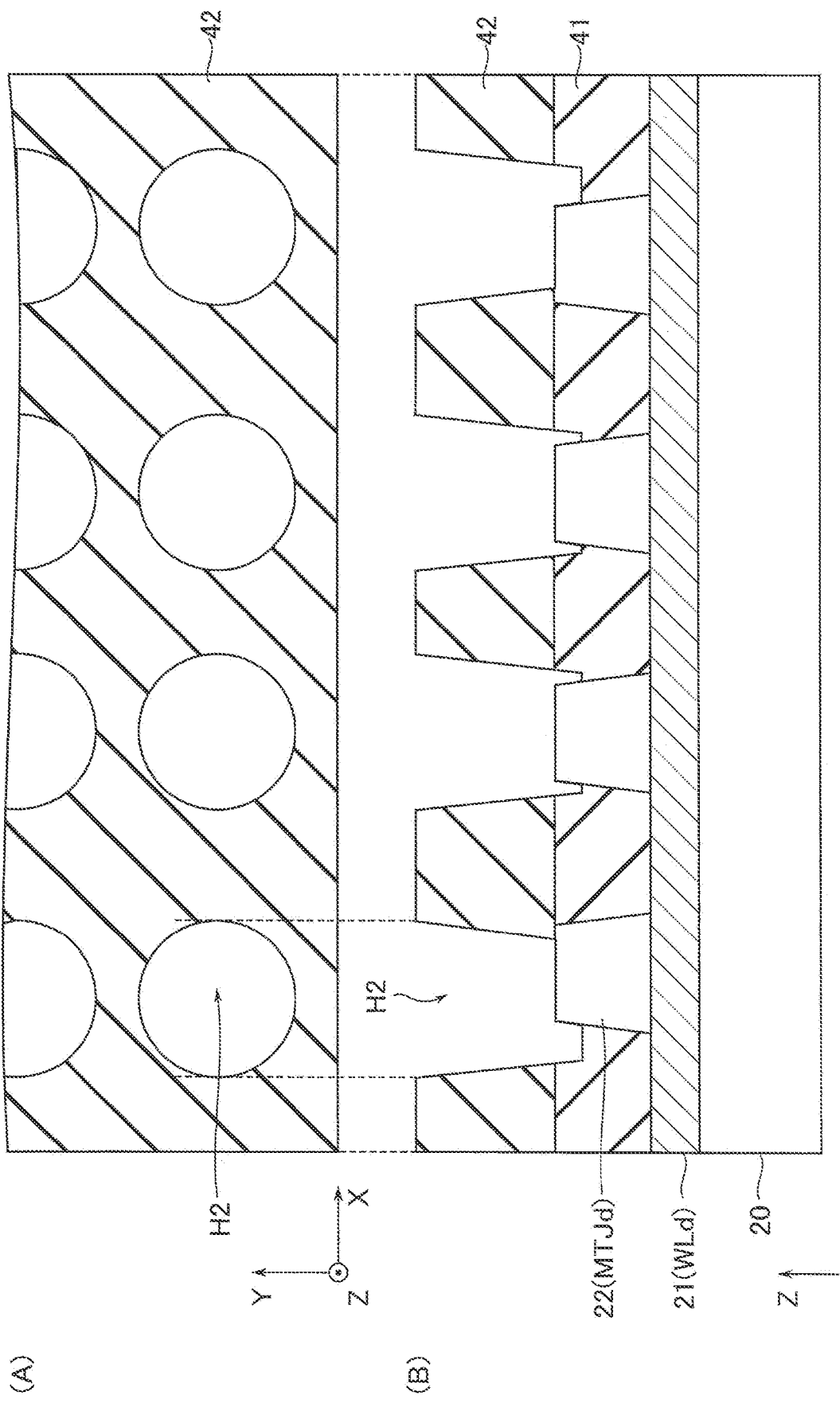
FIG. 16 is a schematic diagram illustrating a method of manufacturing the memory cell array of the magnetic memory device according to the third embodiment.

Next, an insulating layer 42 is provided throughout the surface as illustrated in FIG. 16. In the insulating layer 42, portions where the switching element member 23 and the conductor 24 are to be provided are selectively removed by, for example, photolithography and anisotropic etching. Thereby, a plurality of holes H2 are formed in the insulating layer 42. However, the holes H2 may be formed to be eccentric with respect to the element 22 due to various factors in manufacturing processes.

In anisotropic etching to form the holes H2, the etching rate of the element 22 is smaller than that of the insulating layer 42 and the insulator 41. Thus, in the etching process, at the portion where the element 22 is exposed, etching progress mostly stops, whereas the outside of the element 22 (i.e., the portion where the insulator 41 is exposed) is continuously etched. Thus, if the hole H2 is eccentric with respect to the element 22, a region where etching progresses to a portion below the upper surface of the element 22 is likely to be formed in the hole H2.

Figure 17:
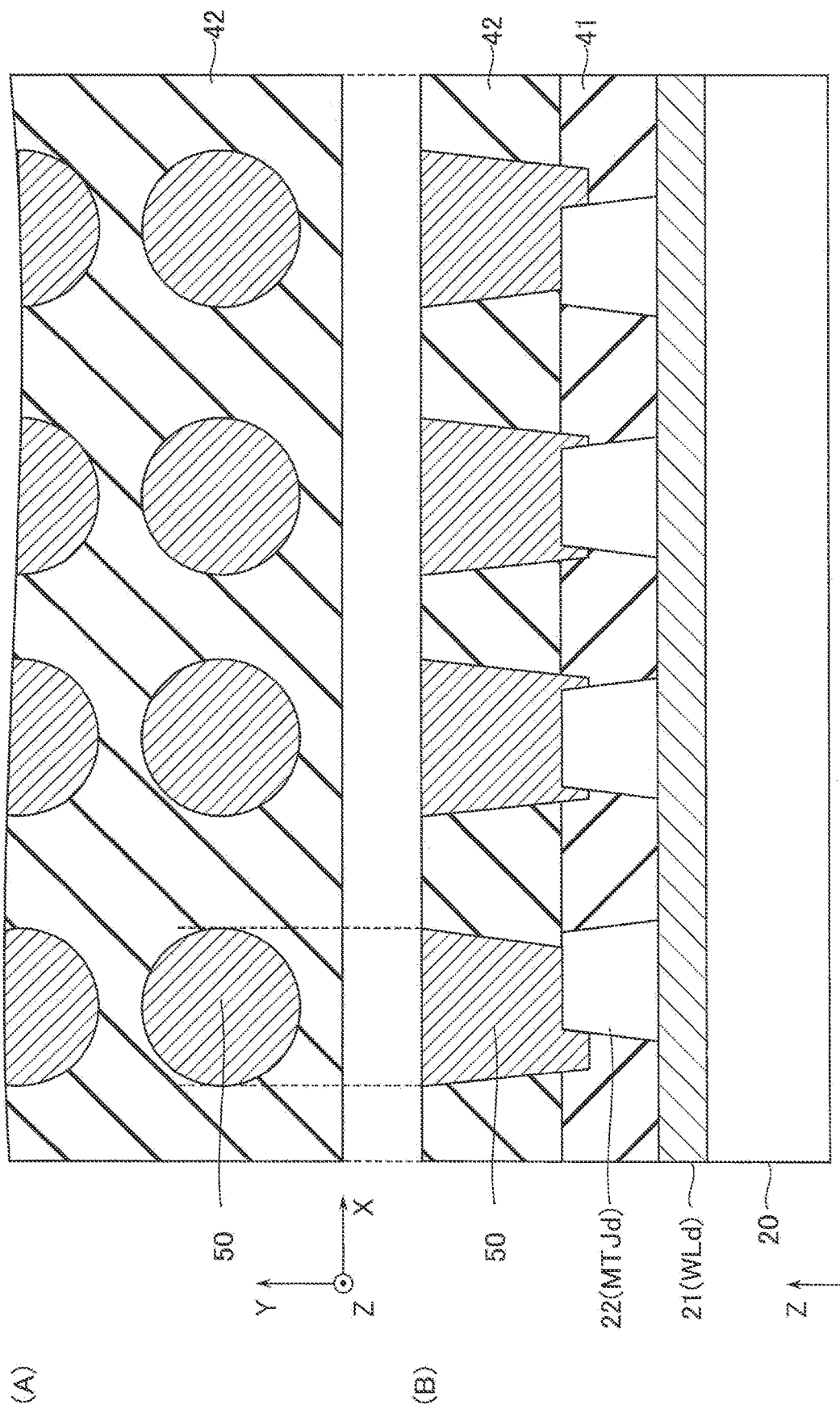
FIG. 17 is a schematic diagram illustrating the method of manufacturing the memory cell array of the magnetic memory device according to the third embodiment.

Next, a conductive layer is provided throughout the surface as illustrated in FIG. 17. The conductive layer is filled in the holes H2. Subsequently, the conductive layer is planarized by, for example, CMP, and a part above the insulating layer 42 is removed. Thereby, the conductive layer is divided into conductors 50 provided in the respective holes H2.

Figure 18:
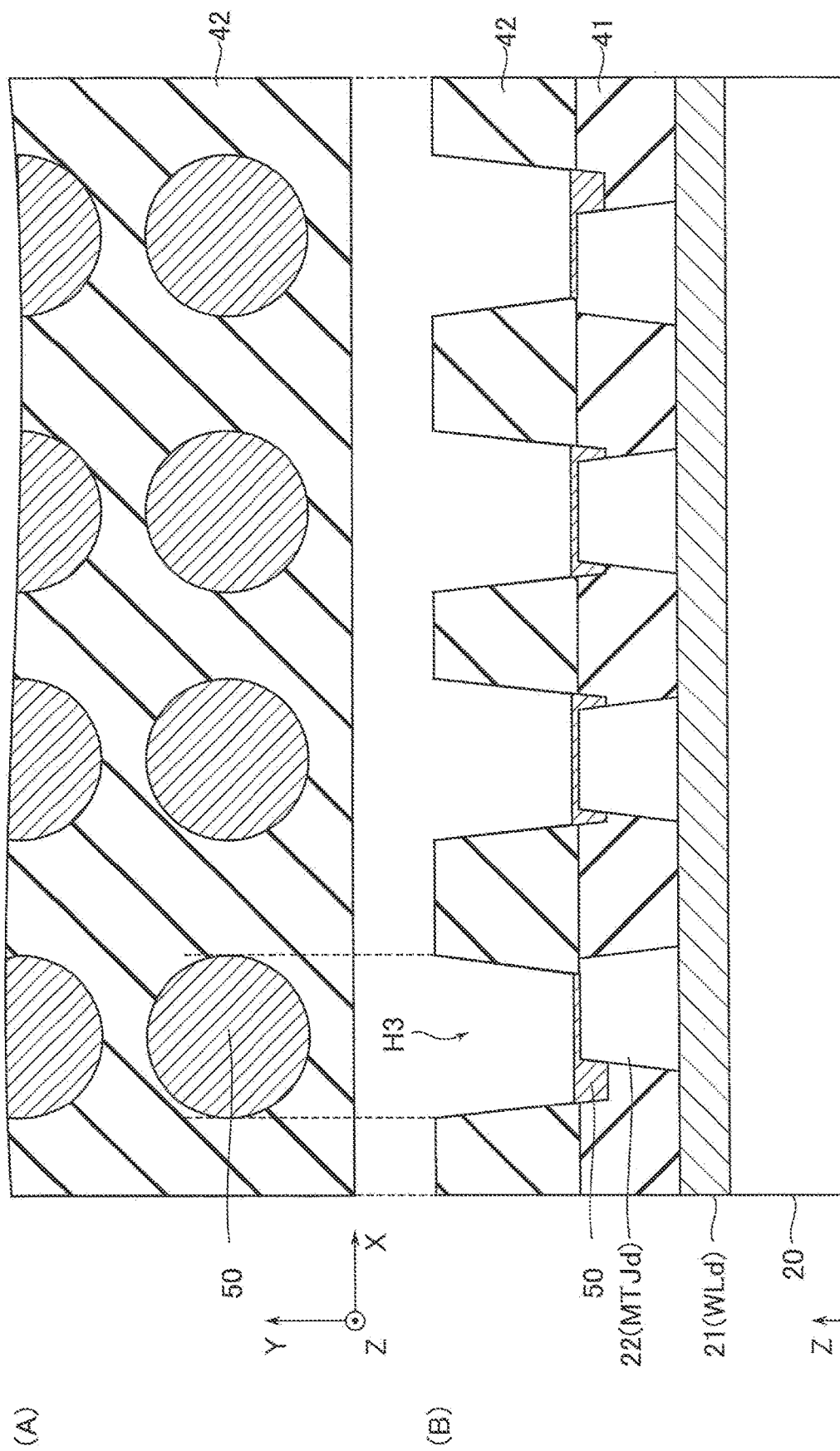
FIG. 18 is a schematic diagram illustrating the method of manufacturing the memory cell array of the magnetic memory device according to the third embodiment.

Subsequently, as illustrated in FIG. 18, by anisotropic etching having a high selection ratio with respect to the conductor 50, a part of the conductor 50 is selectively removed. The conductor 50 is, for example, removed immediately before the upper surface of the element 22 is exposed. Thereby, hole H3, having a flat lower surface, is formed regardless of whether it is directly above the element 22.

Figure 19:
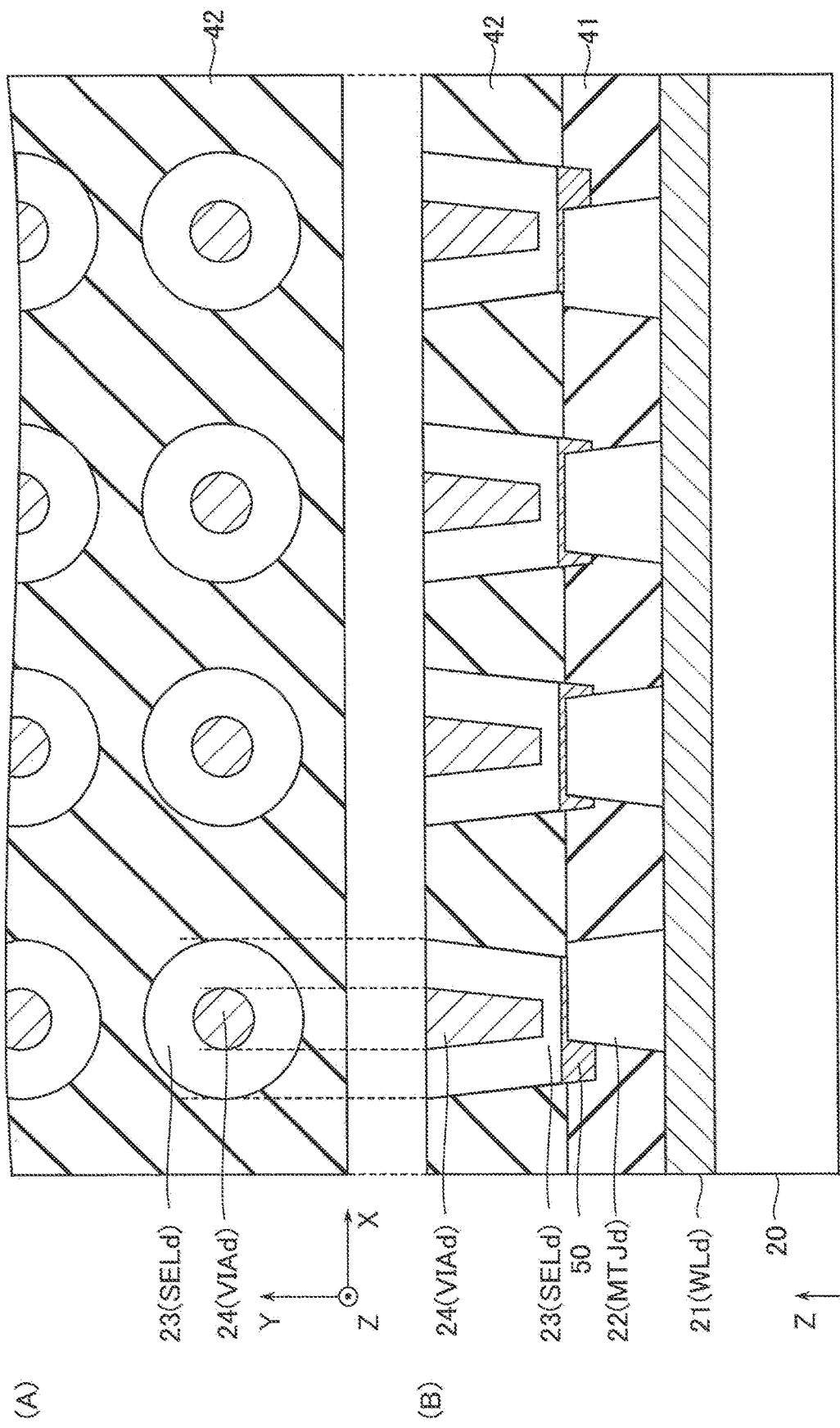
FIG. 19 is a schematic diagram illustrating the method of manufacturing the memory cell array of the magnetic memory device according to the third embodiment.

Next, a switching element layer and a conductive layer are provided throughout the surface as illustrated in FIG. 19. The switching element layer covers the side surface and the lower surface of each of the holes H3. The conductive layer is provided on the upper surface of the switching element layer and filled in the holes H3. Subsequently, the switching element layer and the conductive layer are planarized by, for example, CMP, and a part above the insulating layer 42 is removed. Thereby, the switching element layer and the conductive layer are divided into parts provided in each of the holes H3 (i.e., structures each including the switching element member 23 and the conductor 24).

Thereafter, the portion corresponding to the memory cell MCd is provided by the process similar to that in FIG. 10 of the first embodiment.

3.3 Advantageous Effects of Present Embodiment

When the switching element member 23 is deposited in the hole H2 eccentric with respect to the element 22 without using the conductor 50, the switching element member 23 is provided along the side surface and the upper surface of the element 22. Thus, distortion may be caused at the lower part of the switching element member 23 functioning as the switching element SEL, and this distortion may result in an increase in short circuit According to the third embodiment, in the hole H2, the portion where the side surface of the element 22 is exposed is filled with the conductor 50. Thereby, the lower surface of the switching element member 23 is positioned above the upper surface of the element 22 and has a flat shape. Thus, even if the element 22 and the switching element member 23 are eccentric with respect to each other, occurrence of distortion at the lower part of the switching element member 23 can be suppressed. Therefore, it is possible to suppress an increase in probability of occurrence of a short circuit defect in the switching element SEL.

4. Other

The first to third embodiments described above are merely examples, and can be modified in various manners.

For example, in the first to third embodiments described above, the word line WLd formed on the lowermost layer does not include the switching element member unlike the bit line BL and the word line WLu, but the configuration is not limited thereto. For example, the word line WLd may be formed as a structure including the switching element member similarly to the bit line BL and the word line WLu. Thereby, the process of forming the word line WLd and the process of forming the bit line BL and the word line WLu can be shared. Therefore, performances of interconnects can be made equivalent, and a design load can be reduced.

Figure 20:
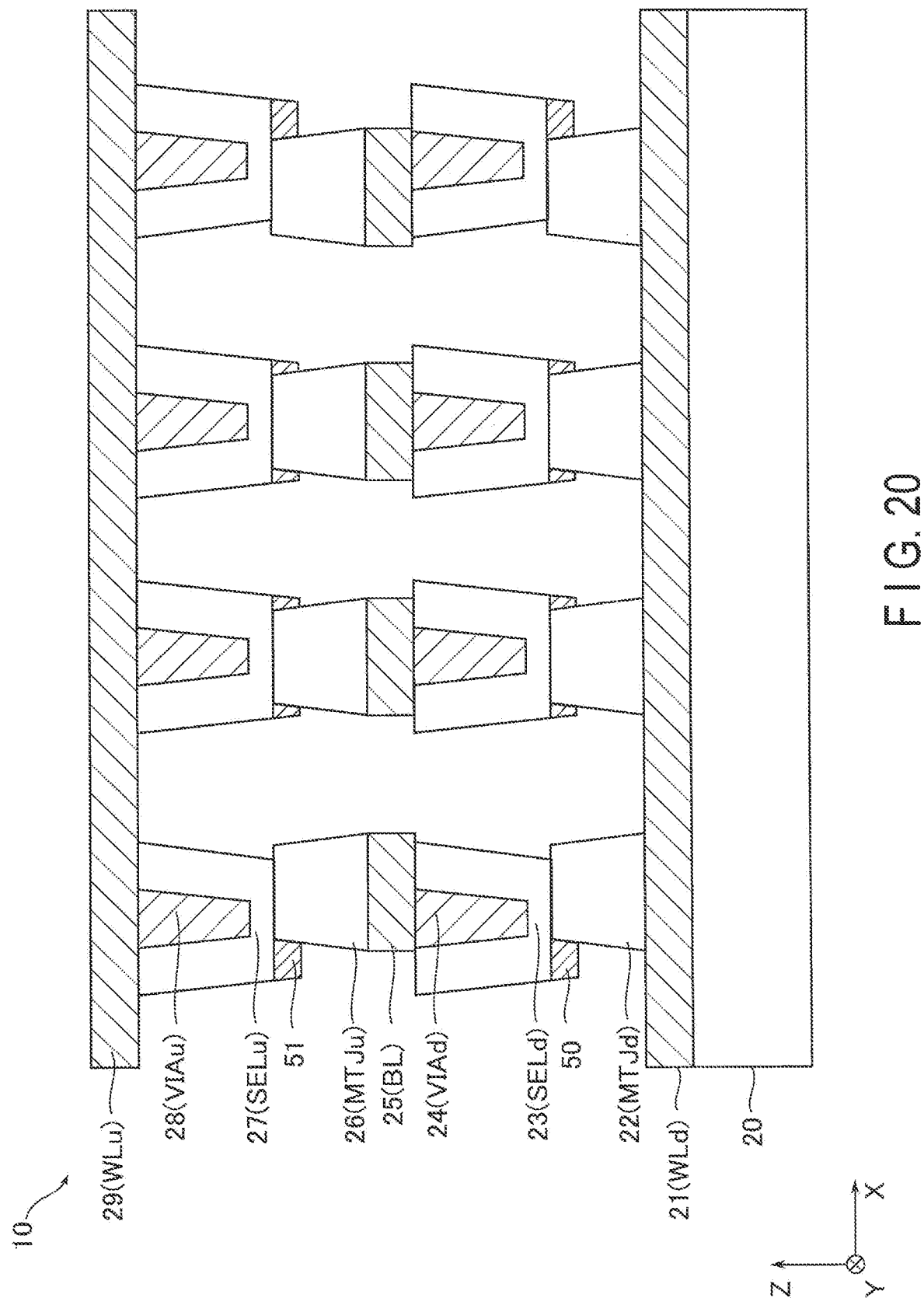
FIG. 20 is a cross-sectional view illustrating a configuration of a memory cell array of a magnetic memory device according to a first modification.

Furthermore, for example, in the third embodiment described above, the conductor 50 includes the first portion between the upper surface of the element 22 and the switching element member 23, but the configuration is not limited thereto. For example, as illustrated in FIG. 20, the height of the upper surface of the conductor 50 may be the same as that of the upper surface of the element 22, and in this case, the lower surface of the switching element member 23 may be in contact with both the upper surface of the element 22 and the upper surface of the conductor 50.

Figure 21:
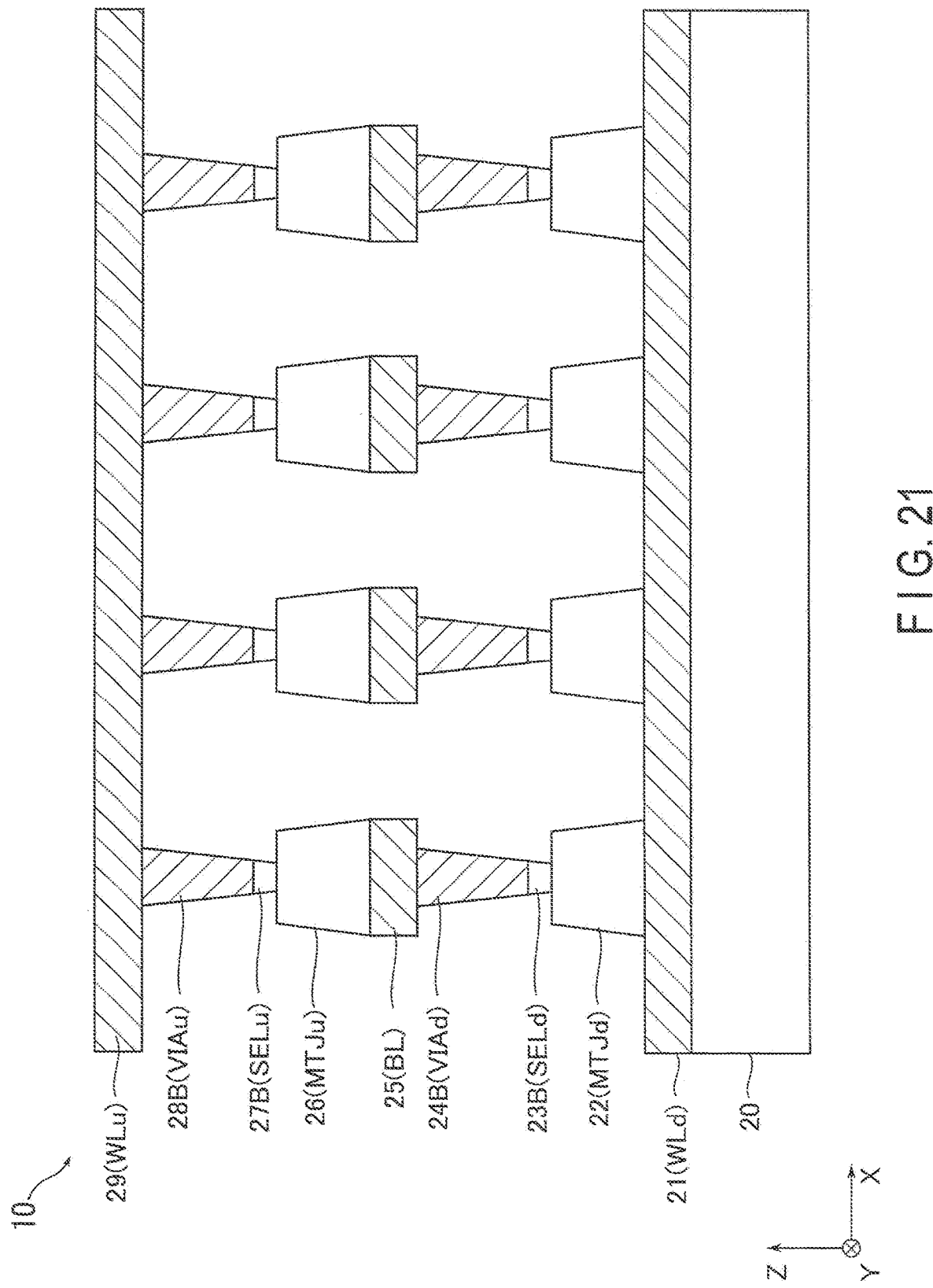
FIG. 21 is a cross-sectional view illustrating a configuration of a memory cell array of a magnetic memory device according to a second modification.

Further, for example, in the first to third embodiments described above, the switching element member 23 is in contact with the lower and side surfaces of the conductor 24, and the switching element member 27 is in contact with the lower and side surfaces of the conductor 28, but the configuration is not limited thereto. For example, as illustrated in FIG. 21, the switching element member 23B may have a reverse tapered shape, and may include, above the element 22, a portion in contact with the lower surface of the conductor 24B, but not a portion in contact with the side surface of the conductor 24B. Similarly, the switching element member 27B may have a reverse tapered shape, and may include, above the element 26, a portion in contact with the lower surface of the conductor 28B, but not a portion in contact with the side surface of the conductor 28B. The shape may be obtained by, for example, etching back a part of the switching element member 23B (or 27B) formed in a reverse tapered hole or slit, and then depositing the conductor 24B (or 28B). In this case, the area of the upper surface of each of the switching element members 23B and 27B is equal to the area of the lower surface of each of the conductors 24B and 28B.

In addition, in the example of FIG. 21, by making the area of the upper surface of the switching element member 23B (i.e., the lower surface of the conductor 24B) smaller than the area of the upper surface of the element 22, the cross-sectional area of the switching element SELd can be made smaller than that of the magnetoresistance effect element MTJd. Similarly, by making the area of the upper surface of the switching element member 27B (i.e., the lower surface of the conductor 28B) smaller than the area of the upper surface of the element 26, the cross-sectional area of the switching element SELu can be made smaller than that of the magnetoresistance effect element MTJu. Thereby, a probability of occurrence of a short circuit defect in the switching element SEL can be suppressed to a degree no greater than at least the magnetoresistance effect element MTJ.

The magnetoresistance effect element MTJ described in the first to third embodiments above has a top-free structure in which the storage layer SL is positioned above the reference layer RL, but the configuration is not limited thereto. For example, the magnetoresistance effect element MTJ may have a bottom-free structure in which the reference layer RL is positioned above the storage layer SL.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A magnetic memory device, comprising:
a first magnetoresistance effect element provided above a substrate; and
a first switching element member and a first conductor, each provided above the first magnetoresistance effect element,
wherein:
the first switching element member includes a first portion in contact with a lower surface of the first conductor directly above the first magnetoresistance effect element,
an area of a lower surface of the first switching element member is smaller than a cross-sectional area of the first switching element member along the lower surface of the first conductor,
the first switching element member further includes a second portion in contact with a side surface of the first conductor,
an area of the lower surface of the first conductor is smaller than the cross-sectional area, and
the area of the lower surface of the first conductor is smaller than an area of an upper surface of the first magnetoresistance effect element.

2. The device of claim 1, further comprising:
a second magnetoresistance effect element aligned with the first magnetoresistance effect element along a first direction parallel to a surface of the substrate; and
a second switching element member and a second conductor, each provided above the second magnetoresistance effect element,
wherein the second switching element member includes:
a first portion in contact with a lower surface of the second conductor directly above the second magnetoresistance effect element; and
a second portion in contact with a side surface of the second conductor.

3. The device of claim 2, further comprising:
a third conductor in contact with an upper surface of the first conductor and an upper surface of the second conductor, and extending along the first direction;
a fourth conductor in contact with a lower surface of the first magnetoresistance effect element, and extending along a second direction parallel to the surface of the substrate and intersecting the first direction; and
a fifth conductor in contact with a lower surface of the second magnetoresistance effect element, and extending along the second direction.

4. The device of claim 1, wherein the first switching element member and the first conductor extend along a first direction parallel to a surface of the substrate.

5. The device of claim 4, wherein a length of the first conductor along a second direction parallel to the surface of the substrate and intersecting the first direction is shorter than a length of the first magnetoresistance effect element along the second direction.

6. The device of claim 5, further comprising:
a second magnetoresistance effect element aligned with the first magnetoresistance effect element along the first direction,
wherein the first switching element member further includes a third portion in contact with the lower surface of the first conductor directly above the second magnetoresistance effect element.

7. The device of claim 1, further comprising:
a sixth conductor including a first portion in contact with the lower surface of the first switching element member and a side surface of the first magnetoresistance effect element.

8. The device of claim 7, wherein the sixth conductor further includes a second portion between the upper surface of the first magnetoresistance effect element and the lower surface of the first switching element member.

9. A method of manufacturing the device of claim 1, the method comprising:
providing, above the substrate, the first magnetoresistance effect element and a second magnetoresistance effect element aligned along a first direction parallel to a surface of the substrate;
providing an insulating layer on the upper surface of the first magnetoresistance effect element and an upper surface of the second magnetoresistance effect element;
forming a space reaching the upper surface of the first magnetoresistance effect element and the upper surface of the second magnetoresistance effect element in the insulating layer; and
forming, in the space, a switching element layer and a first conductive layer in order.

10. The method of claim 9, wherein:
the forming the space includes forming a first hole reaching the upper surface of the first magnetoresistance effect element, and a second hole reaching the upper surface of the second magnetoresistance effect element and separated from the first hole, and
the method further comprises dividing the switching element layer and the first conductive layer into the first switching element member and the first conductor in the first hole, and a second switching element and a second conductor in the second hole.

11. The method of claim 10, further comprising:
providing a third conductor in contact with an upper surface of the first conductor and an upper surface of the second conductor and extending along the first direction; and
providing, above the substrate, a fourth conductor and a fifth conductor each extending along a second direction parallel to the surface of the substrate and intersecting the first direction and aligned along the first direction, before providing the first magnetoresistance effect element and the second magnetoresistance effect element,
wherein:
the first magnetoresistance effect element is in contact with an upper surface of the fourth conductor, and
the second magnetoresistance effect element is in contact with an upper surface of the fifth conductor.

12. The method of claim 9, wherein the forming the space includes forming a slit, the slit reaching the upper surface of the first magnetoresistance effect element and the upper surface of the second magnetoresistance effect element, and extending along the first direction.

13. The method of claim 12, wherein a length of the first conductor along a second direction parallel to the surface of the substrate and intersecting the first direction is shorter than a length of the first magnetoresistance effect element along the second direction.

14. The method of claim 13, further comprising:
providing, above the substrate, a fourth conductor and a fifth conductor each extending along the second direction and aligned along the first direction, before providing the first magnetoresistance effect element and the second magnetoresistance effect element,
wherein:
the first magnetoresistance effect element is in contact with an upper surface of the fourth conductor,
the second magnetoresistance effect element is in contact with an upper surface of the fifth conductor.

15. The method of claim 9, wherein:
a lower surface of the space is positioned below the upper surface of the first magnetoresistance effect element and the upper surface of the second magnetoresistance effect element,
the method further comprises:
forming a second conductive layer in the space before forming the switching element layer and the first conductive layer; and
removing the second conductive layer except for a portion positioned below the upper surface of the first magnetoresistance effect element and the upper surface of the second magnetoresistance effect element, and
the forming the switching element layer and the first conductive layer includes forming the switching element layer and the first conductive layer in order in the space after removal of the second conductive layer except for the portion.

16. The device of claim 1, wherein:
the first switching element member is in contact with the first magnetoresistance effect element, and
the first portion consists of a single first portion provided between the first conductor and the first magnetoresistance effect element.

17. The device of claim 16, further comprising:
a third conductor extending in a first direction parallel to a surface of the substrate, and having a lower surface in contact with an upper surface of the first conductor,
wherein:
the first switching element has an upper surface having a first region in contact with the lower surface of the third conductor, and a second region separated from the third conductor, and
a length of the upper surface of the first switching element in a second direction parallel to the surface of the substrate and intersecting the first direction is longer than a length of the lower surface of the third conductor in the second direction.

18. The device of claim 1, wherein the first magnetoresistance effect element, the first switching member, and the first conductor are arranged in an order of the first magnetoresistance effect element, the first switching member, and the first conductor in a third direction intersecting a surface of the substrate.

\* \* \* \* \*